United States Patent
Kremin et al.

(10) Patent No.: US 9,442,146 B2
(45) Date of Patent: Sep. 13, 2016

(54) MULTI-MODE CAPACITIVE SENSING DEVICE AND METHOD WITH CURRENT CONVEYOR

(71) Applicant: Parade Technologies, Ltd., Santa Clara, CA (US)

(72) Inventors: Viktor Kremin, Lviv (UA); Andriy Maharyta, Lviv (UA)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 0 days.

(21) Appl. No.: 14/514,204

(22) Filed: Oct. 14, 2014

(65) Prior Publication Data
US 2015/0097584 A1  Apr. 9, 2015

Related U.S. Application Data

(63) Continuation of application No. 12/507,614, filed on Jul. 22, 2009, now Pat. No. 8,866,500.

(60) Provisional application No. 61/163,531, filed on Mar. 26, 2009.

(51) Int. Cl.
*G01R 27/26* (2006.01)
*H03K 17/955* (2006.01)
(Continued)

(52) U.S. Cl.
CPC ........... *G01R 27/2605* (2013.01); *G06F 3/044* (2013.01); *H03K 17/955* (2013.01); *H03K 17/9622* (2013.01); *H03K 2217/960725* (2013.01)

(58) Field of Classification Search
CPC .... G06F 3/044; G06F 3/0416; G06F 3/0418; G06F 2203/04104; G06F 2200/1637; G06F 3/0414; G06F 2203/04107; G06F 3/0354; H03K 17/955; H03K 2217/960725; H03K 2217/960715; G01R 27/2605; G09G 2320/0295; G09G 3/006; G09G 2310/0251; G09G 2320/029; G09G 3/00; G09G 3/3233; G09G 3/3283; G09G 3/3291; G11C 2207/063; G01D 5/2417; G01L 9/00
See application file for complete search history.

(56) References Cited

U.S. PATENT DOCUMENTS

| | | |
|---|---|---|
| 3,903,478 A | 9/1975 | Stuart et al. |
| 4,039,940 A | 8/1977 | Butler et al. |
| 4,145,748 A | 3/1979 | Eichelberger et al. |

(Continued)

FOREIGN PATENT DOCUMENTS

| | | |
|---|---|---|
| CN | 101632059 A | 1/2010 |
| CN | 101639750 A | 2/2010 |

(Continued)

OTHER PUBLICATIONS

"Sigma-Delta ADCs and DACs, AN-283 Application Note, Analog Devices," 1993; Downloaded from <http://www.analog.com/UpoloadedFiles/Application_Notes/292524291525717245054923680458171AN283.pdf>; 16 pages.

(Continued)

*Primary Examiner* — Vinh Nguyen
(74) *Attorney, Agent, or Firm* — Morgan, Lewis & Bockius LLP

(57) ABSTRACT

An apparatus for and a method of sensing capacitance of one or more sensor elements in multiple capacitance sensing modes, including a self-capacitance sensing mode and a mutual capacitance sensing mode.

18 Claims, 17 Drawing Sheets

(51) Int. Cl.
  *H03K 17/96* (2006.01)
  *G06F 3/044* (2006.01)

(56) References Cited

U.S. PATENT DOCUMENTS

| | | |
|---|---|---|
| 4,264,903 A | 4/1981 | Bigelow |
| 4,283,713 A | 8/1981 | Philipp |
| 4,293,734 A | 10/1981 | Pepper |
| 4,438,404 A | 3/1984 | Philipp |
| 4,475,151 A | 10/1984 | Philipp |
| 4,497,575 A | 2/1985 | Philipp |
| 4,614,937 A | 9/1986 | Poujois |
| 4,728,932 A | 3/1988 | Atherton |
| 4,736,097 A | 4/1988 | Philipp |
| 4,736,191 A | 4/1988 | Matzke et al. |
| 4,742,331 A | 5/1988 | Barrow et al. |
| 4,772,983 A | 9/1988 | Kerber et al. |
| 4,773,024 A | 9/1988 | Faggin et al. |
| 4,802,103 A | 1/1989 | Faggin et al. |
| 4,825,147 A | 4/1989 | Cook et al. |
| 4,876,534 A | 10/1989 | Mead et al. |
| 4,879,461 A | 11/1989 | Philipp |
| 4,879,505 A | 11/1989 | Barrow et al. |
| 4,920,399 A | 4/1990 | Hall |
| 4,935,702 A | 6/1990 | Mead et al. |
| 4,940,980 A | 7/1990 | Tice |
| 4,953,928 A | 9/1990 | Anderson et al. |
| 4,962,342 A | 10/1990 | Mead et al. |
| 4,982,333 A | 1/1991 | Ackerman et al. |
| 5,049,758 A | 9/1991 | Mead et al. |
| 5,055,719 A | 10/1991 | Hughes |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,095,284 A | 3/1992 | Mead |
| 5,097,305 A | 3/1992 | Mead et al. |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |
| 5,243,554 A | 9/1993 | Allen et al. |
| 5,248,873 A | 9/1993 | Allen et al. |
| 5,260,592 A | 11/1993 | Mead et al. |
| 5,270,963 A | 12/1993 | Allen et al. |
| 5,276,407 A | 1/1994 | Mead et al. |
| 5,281,862 A | 1/1994 | Ma |
| 5,289,023 A | 2/1994 | Mead |
| 5,294,889 A | 3/1994 | Heep et al. |
| 5,303,329 A | 4/1994 | Mead et al. |
| 5,305,017 A | 4/1994 | Gerpheide |
| 5,323,158 A | 6/1994 | Ferguson, Jr. |
| 5,324,958 A | 6/1994 | Mead et al. |
| 5,331,215 A | 7/1994 | Allen et al. |
| 5,336,936 A | 8/1994 | Allen et al. |
| 5,339,213 A | 8/1994 | O'Callaghan |
| 5,349,303 A | 9/1994 | Gerpheide |
| 5,374,787 A | 12/1994 | Miller et al. |
| 5,381,515 A | 1/1995 | Platt et al. |
| 5,384,467 A | 1/1995 | Plimon et al. |
| 5,408,194 A | 4/1995 | Steinbach et al. |
| 5,412,387 A | 5/1995 | Vincelette et al. |
| 5,442,347 A | 8/1995 | Vranish |
| 5,488,204 A | 1/1996 | Mead et al. |
| 5,495,077 A | 2/1996 | Miller et al. |
| 5,541,600 A | 7/1996 | Blumenkrantz et al. |
| 5,541,878 A | 7/1996 | LeMoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,555,907 A | 9/1996 | Philipp |
| 5,565,658 A | 10/1996 | Gerpheide et al. |
| 5,566,702 A | 10/1996 | Philipp |
| 5,572,205 A | 11/1996 | Caldwell et al. |
| 5,629,629 A | 5/1997 | Tielert et al. |
| 5,629,891 A | 5/1997 | LeMoncheck et al. |
| 5,648,642 A | 7/1997 | Miller et al. |
| 5,672,959 A | 9/1997 | Der |
| 5,682,032 A | 10/1997 | Philipp |
| 5,684,487 A | 11/1997 | Timko |
| 5,730,165 A | 3/1998 | Philipp |
| 5,757,368 A | 5/1998 | Gerpheide et al. |
| 5,760,852 A | 6/1998 | Wu et al. |
| 5,763,909 A | 6/1998 | Mead et al. |
| 5,763,924 A | 6/1998 | Lum et al. |
| 5,767,457 A | 6/1998 | Gerpheide et al. |
| 5,796,183 A | 8/1998 | Hourmand |
| 5,801,340 A | 9/1998 | Peter |
| 5,812,698 A | 9/1998 | Platt et al. |
| 5,841,078 A | 11/1998 | Miller et al. |
| 5,844,265 A | 12/1998 | Mead et al. |
| 5,854,625 A | 12/1998 | Frisch et al. |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,880,411 A | 3/1999 | Gillespie et al. |
| 5,889,236 A | 3/1999 | Gillespie et al. |
| 5,914,465 A | 6/1999 | Allen et al. |
| 5,914,708 A | 6/1999 | LaGrange et al. |
| 5,920,309 A | 7/1999 | Bisset et al. |
| 5,920,310 A | 7/1999 | Faggin et al. |
| 5,926,566 A | 7/1999 | Wang et al. |
| 5,942,733 A | 8/1999 | Allen et al. |
| 5,943,052 A | 8/1999 | Allen et al. |
| 5,969,513 A | 10/1999 | Clark |
| 6,023,422 A | 2/2000 | Allen et al. |
| 6,028,271 A | 2/2000 | Gillespie et al. |
| 6,028,959 A | 2/2000 | Wang et al. |
| 6,097,432 A | 8/2000 | Mead et al. |
| 6,148,104 A | 11/2000 | Wang et al. |
| 6,151,967 A | 11/2000 | McIntosh et al. |
| 6,185,450 B1 | 2/2001 | Seguine et al. |
| 6,188,228 B1 | 2/2001 | Philipp |
| 6,188,391 B1 | 2/2001 | Seely et al. |
| 6,191,723 B1 | 2/2001 | Lewis |
| 6,211,743 B1 | 4/2001 | Rhee et al. |
| 6,222,528 B1 | 4/2001 | Gerpheide et al. |
| 6,239,389 B1 | 5/2001 | Allen et al. |
| 6,249,447 B1 | 6/2001 | Boylan et al. |
| 6,262,717 B1 | 7/2001 | Donohue et al. |
| 6,271,719 B1 | 8/2001 | Sevastopoulos |
| 6,271,720 B1 | 8/2001 | Sevastopoulos |
| 6,280,391 B1 | 8/2001 | Olson et al. |
| 6,288,707 B1 | 9/2001 | Philipp |
| 6,304,014 B1 | 10/2001 | England et al. |
| 6,320,184 B1 | 11/2001 | Winklhofer et al. |
| 6,323,846 B1 | 11/2001 | Westerman et al. |
| 6,326,859 B1 | 12/2001 | Goldman et al. |
| 6,342,817 B1 | 1/2002 | Crofts et al. |
| 6,344,773 B1 | 2/2002 | Sevastopoulos et al. |
| 6,353,200 B1 | 3/2002 | Schwankhart |
| 6,366,099 B1 | 4/2002 | Reddi |
| 6,377,009 B1 | 4/2002 | Philipp |
| 6,380,929 B1 | 4/2002 | Platt |
| 6,380,931 B1 | 4/2002 | Gillespie et al. |
| 6,414,671 B1 | 7/2002 | Gillespie et al. |
| 6,430,305 B1 | 8/2002 | Decker |
| 6,441,073 B1 | 8/2002 | Tanaka et al. |
| 6,441,682 B1 | 8/2002 | Vinn et al. |
| 6,445,257 B1 | 9/2002 | Cox et al. |
| 6,452,514 B1 | 9/2002 | Philipp |
| 6,457,355 B1 | 10/2002 | Philipp |
| 6,459,321 B1 | 10/2002 | Belch |
| 6,466,036 B1 | 10/2002 | Philipp |
| 6,473,069 B1 | 10/2002 | Gerpheide |

(56) References Cited

U.S. PATENT DOCUMENTS

| | | |
|---|---|---|
| 6,489,899 B1 | 12/2002 | Ely et al. |
| 6,498,720 B2 | 12/2002 | Glad |
| 6,499,359 B1 | 12/2002 | Washeleski et al. |
| 6,522,083 B1 | 2/2003 | Roach |
| 6,522,128 B1 | 2/2003 | Ely et al. |
| 6,522,187 B1 | 2/2003 | Sousa |
| 6,523,416 B2 | 2/2003 | Takagi et al. |
| 6,534,970 B1 | 3/2003 | Ely et al. |
| 6,535,200 B2 | 3/2003 | Philipp |
| 6,570,557 B1 | 5/2003 | Westerman et al. |
| 6,587,093 B1 | 7/2003 | Shaw et al. |
| 6,610,936 B2 | 8/2003 | Gillespie et al. |
| 6,614,313 B2 | 9/2003 | Crofts et al. |
| 6,624,640 B2 | 9/2003 | Lund et al. |
| 6,639,586 B2 | 10/2003 | Gerpheide |
| 6,642,857 B1 | 11/2003 | Schediwy et al. |
| 6,649,924 B1 | 11/2003 | Philipp et al. |
| 6,667,740 B2 | 12/2003 | Ely et al. |
| 6,673,308 B2 | 1/2004 | Hino et al. |
| 6,677,932 B1 | 1/2004 | Westerman |
| 6,680,731 B2 | 1/2004 | Gerpheide et al. |
| 6,683,462 B2 | 1/2004 | Shimizu |
| 6,693,572 B1 | 2/2004 | Oliaei et al. |
| 6,700,392 B2 | 3/2004 | Haase |
| 6,704,005 B2 | 3/2004 | Kato et al. |
| 6,705,511 B1 | 3/2004 | Dames et al. |
| 6,714,817 B2 | 3/2004 | Daynes et al. |
| 6,730,863 B1 | 5/2004 | Gerpheide et al. |
| 6,750,852 B2 | 6/2004 | Gillespie et al. |
| 6,774,644 B2 | 8/2004 | Eberlein |
| 6,788,221 B1 | 9/2004 | Ely et al. |
| 6,788,521 B2 | 9/2004 | Nishi |
| 6,798,218 B2 | 9/2004 | Kasperkovitz |
| 6,809,275 B1 | 10/2004 | Cheng et al. |
| 6,856,433 B2 | 2/2005 | Hatano et al. |
| 6,859,159 B2 | 2/2005 | Michalski |
| 6,873,203 B1 | 3/2005 | Latham, II et al. |
| 6,879,215 B1 | 4/2005 | Roach |
| 6,888,536 B2 | 5/2005 | Westerman et al. |
| 6,888,538 B2 | 5/2005 | Ely et al. |
| 6,893,724 B2 | 5/2005 | Lin et al. |
| 6,903,402 B2 | 6/2005 | Miyazawa |
| 6,904,570 B2 | 6/2005 | Foote et al. |
| 6,914,547 B1 | 7/2005 | Swaroop et al. |
| 6,933,873 B1 | 8/2005 | Horsley et al. |
| 6,949,811 B2 | 9/2005 | Miyazawa |
| 6,958,594 B2 | 10/2005 | Redl et al. |
| 6,969,978 B2 | 11/2005 | Dening |
| 6,970,120 B1 | 11/2005 | Bjornsen |
| 6,970,126 B1 | 11/2005 | McCartney |
| 6,975,123 B1 | 12/2005 | Malang et al. |
| 6,993,607 B2 | 1/2006 | Philipp |
| 7,030,782 B2 | 4/2006 | Ely et al. |
| 7,031,886 B1 | 4/2006 | Hargreaves |
| 7,032,051 B2 | 4/2006 | Reay et al. |
| 7,046,230 B2 | 5/2006 | Zadesky et al. |
| 7,078,916 B2 | 7/2006 | Denison |
| 7,109,978 B2 | 9/2006 | Gillespie et al. |
| 7,119,550 B2 | 10/2006 | Kitano et al. |
| 7,129,935 B2 | 10/2006 | Mackey |
| 7,133,140 B2 | 11/2006 | Lukacs et al. |
| 7,133,793 B2 | 11/2006 | Ely et al. |
| 7,141,968 B2 | 11/2006 | Hibbs et al. |
| 7,141,987 B2 | 11/2006 | Hibbs et al. |
| 7,148,704 B2 | 12/2006 | Philipp |
| 7,151,528 B2 | 12/2006 | Taylor et al. |
| 7,183,851 B2 | 2/2007 | Song |
| 7,208,959 B2 | 4/2007 | Horn et al. |
| 7,212,189 B2 | 5/2007 | Shaw et al |
| 7,235,983 B2 | 6/2007 | O'Dowd et al. |
| 7,253,643 B1 | 8/2007 | Seguine |
| 7,262,609 B2 | 8/2007 | Reynolds |
| 7,288,946 B2 | 10/2007 | Hargreaves et al. |
| 7,288,977 B2 | 10/2007 | Stanley |
| 7,298,124 B2 | 11/2007 | Kan et al. |
| 7,301,350 B2 | 11/2007 | Hargreaves et al. |
| 7,315,793 B2 | 1/2008 | Jean |
| 7,339,580 B2 | 3/2008 | Westerman et al. |
| 7,417,411 B2 | 8/2008 | Hoffman et al. |
| 7,417,441 B2 | 8/2008 | Reynolds |
| 7,423,437 B2 | 9/2008 | Hargreaves et al. |
| 7,449,895 B2 | 11/2008 | Ely et al. |
| 7,450,113 B2 | 11/2008 | Gillespie et al. |
| 7,451,050 B2 | 11/2008 | Hargreaves |
| 7,453,270 B2 | 11/2008 | Hargreaves et al. |
| 7,453,279 B2 | 11/2008 | Corbin, Jr. et al. |
| 7,466,307 B2 | 12/2008 | Trent, Jr. et al. |
| 7,498,822 B2 | 3/2009 | Lee |
| 7,499,040 B2 | 3/2009 | Zadesky et al. |
| 7,521,941 B2 | 4/2009 | Ely et al. |
| 7,535,264 B2 | 5/2009 | Hiller et al. |
| 7,663,607 B2 | 2/2010 | Hotelling et al. |
| 7,683,641 B2 | 3/2010 | Hargreaves et al. |
| 7,724,001 B2 | 5/2010 | Kleven |
| 7,812,827 B2 | 10/2010 | Hotelling et al. |
| 7,825,688 B1 | 11/2010 | Snyder |
| 7,834,862 B2 | 11/2010 | Liao et al. |
| 7,884,621 B2 | 2/2011 | Snyder |
| 7,952,564 B2 | 5/2011 | Hurst et al. |
| 7,973,771 B2 | 7/2011 | Geaghan |
| 7,995,036 B2 | 8/2011 | Perski et al. |
| 8,031,094 B2 | 10/2011 | Hotelling et al. |
| 8,054,090 B2 | 11/2011 | Philipp et al. |
| 8,054,300 B2 * | 11/2011 | Bernstein .............. G06F 3/0416 178/18.06 |
| 8,358,142 B2 | 1/2013 | Maharyta |
| 8,487,639 B1 | 7/2013 | Walsh et al. |
| 9,013,195 B2 | 4/2015 | Kremin et al. |
| 2001/0008478 A1 | 7/2001 | Mcintosh et al. |
| 2001/0020850 A1 | 9/2001 | Mcintosh et al. |
| 2002/0063688 A1 | 5/2002 | Shaw et al. |
| 2002/0180464 A1 | 12/2002 | Tartagni |
| 2002/0191029 A1 | 12/2002 | Gillespie et al. |
| 2003/0062889 A1 | 4/2003 | Ely et al. |
| 2003/0080755 A1 | 5/2003 | Kobayashi |
| 2003/0090277 A1 | 5/2003 | Lechner et al. |
| 2004/0178989 A1 | 9/2004 | Shahoian et al. |
| 2005/0024341 A1 | 2/2005 | Gillespie et al. |
| 2005/0040833 A1 | 2/2005 | Yakabe et al. |
| 2005/0122119 A1 | 6/2005 | Barlow |
| 2006/0001490 A1 | 1/2006 | Song |
| 2006/0032680 A1 | 2/2006 | Elias et al. |
| 2006/0038793 A1 | 2/2006 | Philipp |
| 2006/0066582 A1 | 3/2006 | Lyon et al. |
| 2006/0071674 A1 | 4/2006 | Jean |
| 2006/0097991 A1 | 5/2006 | Hotelling et al. |
| 2006/0138574 A1 | 6/2006 | Saito et al. |
| 2006/0273804 A1 | 12/2006 | Delorme et al. |
| 2007/0075923 A1 | 4/2007 | Beuker et al. |
| 2007/0227253 A1 | 10/2007 | Kleven |
| 2007/0257894 A1 | 11/2007 | Philipp |
| 2007/0268273 A1 | 11/2007 | Westerman et al. |
| 2007/0268274 A1 | 11/2007 | Westerman et al. |
| 2007/0268275 A1 | 11/2007 | Westerman et al. |
| 2008/0007534 A1 | 1/2008 | Peng et al. |
| 2008/0041639 A1 | 2/2008 | Westerman et al. |
| 2008/0041640 A1 | 2/2008 | Gillespie et al. |
| 2008/0042986 A1 | 2/2008 | Westerman et al. |
| 2008/0042987 A1 | 2/2008 | Westerman et al. |
| 2008/0042988 A1 | 2/2008 | Westerman et al. |
| 2008/0042989 A1 | 2/2008 | Westerman et al. |
| 2008/0042994 A1 | 2/2008 | Gillespie et al. |
| 2008/0048997 A1 | 2/2008 | Gillespie et al. |
| 2008/0068100 A1 | 3/2008 | Goodnow et al. |
| 2008/0079699 A1 | 4/2008 | Mackey |
| 2008/0085720 A1 | 4/2008 | Hirano et al. |
| 2008/0088602 A1 | 4/2008 | Hotelling |
| 2008/0111714 A1 | 5/2008 | Kremin |
| 2008/0116904 A1 | 5/2008 | Reynolds et al. |
| 2008/0128182 A1 | 6/2008 | Westerman et al. |
| 2008/0158167 A1 | 7/2008 | Hotelling et al. |
| 2008/0162996 A1 | 7/2008 | Krah et al. |
| 2008/0191714 A1 | 8/2008 | Masuda et al. |
| 2008/0246723 A1 | 10/2008 | Baumbach |

(56) References Cited

U.S. PATENT DOCUMENTS

| | | |
|---|---|---|
| 2008/0278178 A1 | 11/2008 | Philipp |
| 2009/0008161 A1 | 1/2009 | Jones et al. |
| 2009/0009483 A1 | 1/2009 | Hotelling et al. |
| 2009/0009491 A1 | 1/2009 | Grivna |
| 2009/0058802 A1 | 3/2009 | Orsley |
| 2009/0096757 A1 | 4/2009 | Hotelling et al. |
| 2009/0153152 A1 | 6/2009 | Maharyta et al. |
| 2009/0160461 A1 | 6/2009 | Zangl et al. |
| 2009/0194344 A1 | 8/2009 | Harley et al. |
| 2009/0224776 A1 | 9/2009 | Keith |
| 2009/0267622 A1 | 10/2009 | Hansen et al. |
| 2009/0273573 A1 | 11/2009 | Hotelling |
| 2009/0315258 A1 | 12/2009 | Wallace et al. |
| 2010/0026660 A1 | 2/2010 | Kitamura |
| 2010/0033196 A1 | 2/2010 | Hayakawa et al. |
| 2010/0033443 A1 | 2/2010 | Hashimoto |
| 2010/0060591 A1 | 3/2010 | Yousefpor et al. |
| 2010/0060622 A1 | 3/2010 | Van Der et al. |
| 2010/0073323 A1 | 3/2010 | Geaghan |
| 2010/0073325 A1 | 3/2010 | Yang |
| 2010/0073341 A1 | 3/2010 | Toyooka et al. |
| 2010/0110038 A1 | 5/2010 | Mo et al. |
| 2010/0139991 A1 | 6/2010 | Philipp et al. |
| 2010/0141605 A1 | 6/2010 | Kang et al. |
| 2010/0149127 A1 | 6/2010 | Fisher et al. |
| 2010/0201382 A1 | 8/2010 | Welland |
| 2010/0219846 A1 | 9/2010 | Dubery |
| 2010/0244859 A1 | 9/2010 | Cormier, Jr. et al. |
| 2010/0295564 A1 | 11/2010 | Reynolds |
| 2011/0007021 A1 | 1/2011 | Bernstein et al. |
| 2011/0018557 A1 | 1/2011 | Badaye |
| 2011/0025629 A1 | 2/2011 | Grivna et al. |
| 2011/0055305 A1 | 3/2011 | Matsushima |
| 2011/0063154 A1 | 3/2011 | Hotelling et al. |
| 2011/0109568 A1 | 5/2011 | Wu et al. |
| 2011/0163992 A1 | 7/2011 | Cordeiro et al. |
| 2011/0254802 A1 | 10/2011 | Philipp |
| 2012/0013565 A1 | 1/2012 | Westhues et al. |
| 2012/0049868 A1 | 3/2012 | Maharyta |
| 2012/0256869 A1 | 10/2012 | Walsh et al. |

FOREIGN PATENT DOCUMENTS

| | | |
|---|---|---|
| CN | 101644980 A | 2/2010 |
| KR | 2006/0132145 A | 12/2006 |
| KR | 20080096977 A | 11/2008 |
| WO | W02007128682 A1 | 11/2007 |
| WO | 2008085720 A | 7/2008 |

OTHER PUBLICATIONS

A. Fabre, "Third-Generation Current Conveyor: a New Helpful Active Element," Electronics Letters, vol. 31, No. 5, Mar. 1995, pp. 338-339; 2 pages.

Adisak Monopapassorn, "CMOS High Frequency/Low Voltage Full-Wave Rectifier," Thammasat International Journal of Science and Technology, vol. 8, No. 2, Apr.-Jun. 2003; 11 pages.

Ahmed M. Soliman, "Generation of Current Conveyor-Based All-Pass Filters from Op Amp-Based Circuits," IEEE Transactions on Circuits and Systems II: Analog and Digital Signal Processing, vol. 44, No. 4, Apr. 1997, pp. 324-330; 7 pages.

U.S. Appl. No. 12/507,614: "Multi-Functional Capacitance Sensing Circuit With a Current Conveyor," Viktor Kremin, filed Jul. 22, 2009; 56 pages.

U.S. Appl. No. 12/623,661: "Receive Demodulator for Capacitive Sensnig" Paul Walsh et al., filed Nov. 23, 2009; 48 pages.

U.S. Appl. No. 13/185,447: "Capacitance Sensing Systems, Circuits and Methods That Include Current Conveyor Based Oscillators," Andriy Maharyta, filed Jul. 18, 2011; 58 pages.

U.S. Appl. No. 13/249,514: "Active Integrator for a Capacitive Sense Array," Paul Walsh, filed Sep. 30, 2011; 46 pages.

Assi et al., "An Offset Compensated and High-Gain CMOS Current-Feedback Op-Amp," IEEE Transactions on Circuits and Systems I: Fundamental Theory and Applications, vol. 45, No. 1, Jan. 1998, pp. 85-90; 6 pages.

Calvo et al., "Novel High Performance CMOS Current Conveyor," Microelectronics Reliability, Mar. 2003, pp. 955-961; 7 pages.

Cataldo et al., "Active Capacitance Multipliers Using Current Conveyors," Proceedings of the 1998 IEEE International Symposium on Circuits and Systems, vol. 2, Jun. 1998, pp. 343-346; 4 pages.

Chapweske, Adam; "The PS/2 Mouse Interface," PS/2 Mouse Interfacing, 2001, retrieved on May 18, 2006; 10 pages.

CSD User Module Data Sheet, Cypress Semiconductor Corporation CSD v 1.0, Oct. 23, 2006; 58 pages.

Cypress Semiconductor Corporation, "CY8C21x34 Data Sheet," CSR User Module, CSR V.1.0; Oct. 6, 2005; 36 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Cypress Semiconductor Corporation, "FAN Controller CG6457AM and CG6462AM," PSoC Mixed Signal Array Preliminary Data Sheet; May 24, 2005; 25 pages.

Cypress Semiconductor Corporation, "PSoC CY8C20x34 Technical Reference Manual (TRM)," PSoC CY8C20x34 TRM, Version 1.0, 2006; 218 pages.

Cypress Semiconductor Corporation, "PSoC Mixed-Signal Controllers," Production Description; <http://www.cypress.com/portal/server>; retrieved on Sep. 27, 2005; 2 pages.

Cypress Semiconductor Corporation, "Release Notes srn017," Jan. 24, 2007; 3 pages.

Dave Van Ess, "Understanding Switched Capacitor Analog Blocks," Application Note AN2041, Mar. 30, 2004; 16 pages.

Dennis Seguine, "Capacitive Switch Scan," Cypress Application Note AN2233a, Revision B, Apr. 14, 2005; 6 pages.

Elwan et al., "Low-Voltage Low-Power CMOS Current Conveyors," IEEE Transactions on Circuits and System I: Fundamental Theory and Applications, vol. 44, No. 9, Sep. 1997; pp. 828-835; 8 pages.

Ibrahim et al., "A CMOS Realization of Inverting Second Generation Current Conveyor 'Positive' (ICCII+)," The Norwegian Signal Processing Society and IEEE 5th Nordic Signal Processing Symposium, Oct. 2002; 4 pages.

Ibrahime et al., "A New Voltage Scaling Type Digital-Analog Converter Using Only DDCCS," 3rd International Conference on Electrical and Electronics Engineering, 2003; 4 pages.

Imazeki et al., "Low-Voltage, Low-Power, Second-Generation Current Conveyors," Electrical Engineering in Japan, vol. 138, No. 2, Nov. 2001, pp. 41-48; 8 pages.

International Search Report and Written Opinion for Application No. PCT/US11/67153 dated Apr. 24, 2012; 8 pages.

International Search Report for International Application No. PCT/US10/28943 mailed on Sep. 7, 2010; 2 pages.

James Quan, "CMOS Programmable Gain Circuits: Amplifiers and Current Conveyors," The University of Calgary, Aug. 2005; 141 pages.

Kayed et al., "VLSI Design and Implementation of CMOS Current Conveyors," The Eleventh International Conference on Microelectronics, Nov. 1999, pp. 55-57; 3 pages.

Kimmo Koli, "CMOS Current Amplifiers: Speed versus Nonlinearity," Dissertation, Nov. 2000; 305 pages.

L. Grigorescu, "Amplifiers Built with Current-Conveyors," Sep. 2006, pp. 105-109; 5 pages.

Lee, Mark; "EMC Design Considerations for PSoC CapSense Applications," Cypress Semiconductor Corporation, Application Note AN2318; Sep. 16, 2005; 6 pages.

Madian et al., "New 1.5-V CMOS Second Generation Current Conveyor Based on Wide Range Transconductor," Analog Integrated Circuits and Signal Processing, Springer Netherlands, Sep. 2006, pp. 267-279; 13 pages.

Mahmoud et al., "Low-Voltage CMOS Current Feedback Operational Amplifier and Its Application," ETRI Journal, vol. 29, No. 2, Apr. 2007, pp. 212-218; 7 pages.

(56) References Cited

OTHER PUBLICATIONS

Maitreechit et al., "A Full-Wave Rectifier Using a Current Conveyor and Current Mirrors with Improved Efficiency," Thammasat International Journal of Science and Technology, vol. 10, No. 2, Apr.-Jun. 2005, pp. 21-27; 7 pages.

Mark Lee, "CapSense Best Practices," Cypress Application Note AN2394; Oct. 19, 2006; 10 pages.

Masciotti et al., "CMOS Current-Mode Analog Circuit Building Blocks for RF DC-DC Converter Controllers," Proceedings of the 2003 International Symposium on Circuits and Systems, May 2003, vol. 3, pp. 455-458; 4 pages.

Maundy et al., "A New Configuration for Current Feedback Operational Amplifiers," The 2002 45th Midwest Symposium on Circuits and Systems, vol. 1, Aug. 2002, pp. 547-550; 4 pages.

Minaei et al., "High Performance CMOS Realization of the Third Generation Current Conveyor (CCIII)," MWSCAS, 2002, 16 pages.

Mohit Kumar, "Low-Voltage Current-Mode Analog Cells," M. Tech. Credit Seminar Report, Electronic Systems Group, Nov. 2002, 16 pages.

Montree Siripruchyanun, "Second Generation Current Conveyor (CCII)," PowerPoint Presentation, Jan. 2008; 29 pages.

Pawarangkoon et al., "Four-Quadrant Current-Mode Divider Based on Current Conveyors," IEEE Region 10 Conference TENCON, Nov. 2004, vol. 4, pp. 380-383; 4 pages.

Premont et al., "Current-Conveyor Based Field Programmable Analog Array," Analog Integrated Circuits and Signal Processing, Sep. 1998, vol. 17, pp. 155-157; 3 pages.

U.S. Appl. No. 61/163,531: "Multifunctional Capacitance Sensing Front-end Circuit with Current Conveyor," Viktor Kremin, filed Mar. 26, 2009; 18 pages.

Rajpiit et al., "Low Voltage, Low Power, High Performance Current Conveyors," The 2001 IEEE International Symposium on Circuits and Systems, May 2001, vol. 1, pp. 723-726; 4 pages.

Rajput et al., "Advanced Applications of Current Conveyors: A Tutorial," J. of Active and Passive Electronic Devices, vol. 2, 2007, Old City Publishing Inc., pp. 143-164; 22 pages.

Robert Jania, "Cypress' CapSense Successive Approximation Algorithm," Whiat Paper CSA RJO.doc, Jan. 17, 2007; 6 pages.

Ryan Seguine et al., "Layout Guidelines for PSoC CapSense", Cypress Application Note AN2292, Revision B, Oct. 31, 2005, pp. 1-15.

S. Minaei, "A New High Performance CMOS Third Generation Current Conveyor (CCIII) and its Application," Electrical Engineering, vol. 85, No. 3, Springer-Verlag, Jul. 2003, pp. 147-153; 7 pages.

Salem et al., "A 2.5V 0.35um CMOS Current Conveyor and High Frequency High-Q Band-Pass Filter," The 16th International Conference on Microelectronics, Dec. 2004, pp. 328-333; 6 pages.

U.S. Appl. No. 14/071,107, "Receive Demodulator for Capacitive Sensing," Paul M. Walsh, filed Nov. 4, 2013, 40 pgs.

CN Office Action, 201080013632.1 dated Aug. 26, 2013, 6 pgs.

Christopher Ard and Dr. Gaute Myklebust, "Product How-To: Advanced Touch Interface Drivers Enable New User Applications," http://www.eetimes.com/design/analog-design/4008306/PRODUCT-HOW-TO-Advanced-Touch-Interface-Drivers-Enable-New-user-Applications, Jul. 20-22, 2015, 4 pga.

Cypress, International Preliminary Report on Patentability, PCT/US2011/067153, Oct. 8, 2013, 7 pgs.

Cypress, Preliminary Rejection, KR10-2011-7022425, Feb. 19, 2016, 12 pgs.

Lichun Shao, Palaniapan Moorthi, Wan Tan Woei, A Continuous-time capacitance to voltage converter for microcapacitivepressure sensors, Journal of Physics: Conference Series 34 (2006) 1014-1019, 2006, 7 pgs., London, UK.

Mark Lee, "The Art of Capacitive Tough Sensing," Cypress Perform, Published in Embedded.com, http://www.embedded.com, Mar. 2007, 10 pgs.

Ryan Seguine et al., "Capacitive Sensing Techniques and Considerations," Mobile Handset Design Line, Nov. 2007, San Jose, CA, 7 pgs.

U.S. Appl. No. 61/117,031, "Rx Demodulator for CapSense Using a Quasi Differential Channel," Paul Walsh, filed Nov. 21, 2008, 42 pgs.

U.S. Appl. No. 61/376,460, "Mutual Capacitance Sensing Using First Order Relaxation Oscillators," Viktor Kremin, filed Aug. 24, 2010, 17 pgs.

U.S. Appl. No. 61/472,161, "Signal Receipt for a TXRX Capacitance Sensing Panel," Hans Klein, filed Apr. 5, 2011, 12 pgs.

Sander L. J. Gierkink, "Control Linearity and Jitter of Relaxation Oscillators", http://doc.uhwente.nl, 1999, 231 pgs.

Vaness, D., "Understanding Switched Capacitor Analog Blocs," AN2041, Application Note, Mar. 30, 2004, 16 pages.

Walsh Paul, Final Office Acton U.S. Appl. No. 13/249,514, Jan. 29, 2015, 16 pgs.

Walsh Paul, Office Acton U.S. Appl. No. 13/249,514, May 5, 2015, 21 pgs.

Walsh Paul, Office Acton U.S. Appl. No. 14/071,107, Mar. 18, 2015, 12 pgs.

Sangil Park, "Motorola Digital Signal Processors, Principles of Sigma-Delta Modulation for Analog-to-Digital Converters," Rev. 1, downloaded from <http://digitalsignallabs.com/SigmaDelta.pdf>, Mar. 1997; 64 pages.

Sedra et al., "A Second Generation Current Conveyor and Its Application," IEEE Transactions on Circuit Theory, Feb. 1970, vol. 17, pp. 132-134; 3 pages.

Sedra et al., "Current Conveyor Theory and Practice," IEEE Proceedings (Part G), Chapter 3, Apr. 1990, pp. 93-126; 18 pages.

Sedra, Adel S. et al., "Microelectronic Circuits," 3rd Edition, Oxford University Press, pp. xiii-xx and 861-883, 1991; 20 pages.

Seguine, Ryan; "Layout Guidelines for PSoC CapSense," Cypress Semiconductor Corporation, Application Note AN2292; Jul. 22, 2005; 13 pages.

Shah et al., "Cascadable Electronically Tunable Sito Current-Mode Active-Only Universal Filter," 2008; 6 pages.

SIPO Office Action for Application No. 201080013632.1 dated Aug. 1, 2013; 6 pages.

Smith et al., "The Current Conveyor—A New Circuit Building Block," Proceedings of the IEEE, Aug. 1968, pp. 1368-1369; 2 pages.

Soliman A. Mahmoud, "New Fully-Differential CMOS Second-Generation Current Conveyor," ETRI Journal, vol. 28, No. 4, Aug. 2006; pp. 495-501; 7 pages.

USPTO Final Rejection for U.S. Appl. No. 12/507,614 dated Jun. 21, 2011; 17 pages.

USPTO Final Rejection for U.S. Appl. No. 12/507,614 dated Oct. 29, 2013; 6 pages.

USPTO Final Rejection for U.S. Appl. No. 13/739,991 dated Jun. 21, 2013; 8 pages.

USPTO Non-Final Rejection for U.S. Appl. No. 11/600,255 dated Mar. 29, 2010; 10 pages.

USPTO Non-Final Rejection for U.S. Appl. No. 12/507,614 dated Jan. 31, 2011; 15 pages.

USPTO Non-Final Rejection for U.S. Appl. No. 12/507,614 dated Feb. 6, 2014; 6 pages.

USPTO Non-Final Rejection for U.S. Appl. No. 12/623,661 dated May 17, 2012; 13 pages.

USPTO Non-Final Rejection for U.S. Appl. No. 13/185,447 dated Nov. 15, 2013; 5 pages.

USPTO Non-Final Rejection for U.S. Appl. No. 13/249,514 dated Aug. 8, 2014; 13 pages.

USPTO Non-Final Rejection for U.S. Appl. No. 13/297,171 dated Jul. 9, 2013; 8 pages.

USPTO Non-Final Rejection for U.S. Appl. No. 13/739,991 dated Apr. 26, 2013; 11 Pages.

USPTO Notice of Allowance for U.S. Appl. No. 11/489,944 dated Apr. 9, 2007; 7 pages.

USPTO Notice of Allowance for U.S. Appl. No. 11/489,944 dated May 24, 2007; 2 pages.

USPTO Notice of Allowance for U.S. Appl. No. 11/600,255 dated Jul. 27, 2010; 6 pages.

USPTO Notice of Allowance for U.S. Appl. No. 12/507,614 dated May 21, 2014; 7 pages.

(56) References Cited

OTHER PUBLICATIONS

USPTO Notice of Allowance for U.S. Appl. No. 12/507,614 dated Jul. 18, 2014; 7 pages.
USPTO Notice of Allowance for U.S. Appl. No. 12/623,661 dated Apr. 12, 2013; 9 pages.
USPTO Notice of Allowance for U.S. Appl. No. 12/623,661 dated May 29, 2013; 9 pages.
USPTO Notice of Allowance for U.S. Appl. No. 12/623,661 dated Aug. 30, 2012; 8 pages.
USPTO Notice of Allowance for U.S. Appl. No. 13/185,447 dated Mar. 10, 2014; 7 pages.
USPTO Notice of Allowance for U.S. Appl. No. 13/739,991 dated Jul. 22, 2013; 6 pages.
USPTO Notice of Allowance for U.S. Appl. No. 13/739,991 dated Sep. 4, 2013; 6 pages.
USPTO Requirement for Restriction for U.S. Appl. No. 12/507,614 dated Feb. 27, 2013; 12 pages.
USPTO Requirement for Restriction for U.S. Appl. No. 13/185,447 dated Oct. 10, 2013; 8 Pages.
Van Ess, David; "Simulating a 555 Timer with PSoC," Cypress Semiconductor Corporation, Application Note AN2286, May 19, 2005; 10 pages.
Vladislav Golub, Ph.D., "Sigma-Delta ADCs", pub. date: Jun. 17, 2003, 10 pages.
Written Opinion of the International Searching Authority for International Application No. PCT/US 11/67153 mailed Apr. 24, 2012; 9 pages.
Written Opinion of the International Searching Authority for International Application No. PCT/US10/28943 mailed on Sep. 7, 2010; 5 pages.
Cypress Semiconductor Corporation, Office Action, CN201180002807.3, Jul. 3, 2015, 16 pgs.
Fang, W., "Reducing Analog Input Noise in Touch Screen Systems," Jul. 2007, Texas Instruments Application Report, 12 pgs.
Silicon Labs, "How to Minimize Touchscreen Electromagnetic Interference," Silicon Laboratories, Inc. 7 pgs.

\* cited by examiner

| # | Mode | CHANNELS | M1 | M2 | M3 | M4 | $S_M$ |
|---|------|----------|----|----|----|----|----|
| 1 | Self-Capacitance | 2 | C | A | C | A | OFF |
| 2 | Self-Capacitance Differential | 1 | C | A | C | A | ON |
| 3 | Mutual Capacitance, Voltage Input | 2 | A | C | A | C | OFF |
| 4 | Mutual Capacitance, Current Input | 2 | D | A | D | A | OFF |
| 5 | Mutual Capacitance, Voltage Input, Differential | 1 | A | C | A | C | ON |
| 6 | Mutual Capacitance, Current Input, Differential | 1 | D | A | D | A | ON |

MULTI-MODE CAPACITIVE SENSING DEVICE AND METHOD WITH CURRENT CONVEYOR

CROSS-REFERENCE TO RELATED APPLICATIONS

This application is a continuation of U.S. patent application Ser. No. 12/507,614, filed Jul. 22, 2009, now U.S. Pat No. 8,866,500 which claims priority to U.S. Provisional Patent Application No. 61/163,531, filed Mar. 26, 2009, all of which are incorporated by reference herein in their entirety.

TECHNICAL FIELD

The present invention relates generally to touch sensors and, more particularly, to capacitive touch sensors.

BACKGROUND

Capacitive touch sensors may be used to replace mechanical buttons, knobs and other similar mechanical user interface controls. The use of a capacitive sensor allows for the elimination of complicated mechanical switches and buttons, providing reliable operation under harsh conditions. In addition, capacitive sensors are widely used in modern customer applications, providing new user interface options in existing products.

Capacitive touch sensors can be arranged in the form of a sensor array for a touch-sensing surface. When a conductive object, such as a finger, comes in contact or close proximity with the touch-sensing surface, the capacitance of one or more capacitive touch sensors changes. The capacitance changes of the capacitive touch sensors can be measured by an electrical circuit. The electrical circuit, supporting one operation mode, converts the measured capacitances of the capacitive touch sensors into digital values.

There are two main operational modes in the capacitance sensing circuits: self-capacitance sensing and mutual capacitance sensing. The self-capacitance sensing mode is also called single-electrode sensing mode, as each sensor needs only one connection wire to the sensing circuit. For the self-capacitance sensing mode, touching the sensor increases the sensor capacitance as added by the finger touch capacitance is added to the sensor capacitance.

The mutual capacitance change is detected in the mutual capacitance sensing mode. Each sensor uses at least two electrodes: one is a transmitter and the other is a receiver. When a finger touches a sensor or is in close proximity to the sensor, the capacitive coupling between the receiver and the transmitter of the sensor is decreased as the finger shunts part of the electric field to ground.

The capacitance sensing circuits used for the mutual capacitance sensing may have current or voltage inputs. The current input capacitance sensing circuits have low input impedance and provide best external noise suppression abilities. The voltage input capacitance sensing circuits have high input impedance and operate on the capacitive divider operation principle. The voltage input capacitance sensing circuits are suitable for sensing capacitance via high-resistance materials. However, the drawback is poor noise immunity, as potential input circuits may be too sensitive to environmental noise.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

References in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Described herein are apparatuses and methods for sensing capacitance of one or more sensor elements in multiple capacitance sensing modes. In one embodiment, the multiple capacitance sensing modes include a self-capacitance sensing mode, and a mutual capacitance sensing mode. In one embodiment, the self-capacitance sensing mode is a single-electrode, single-ended sensing mode, and the mutual capacitance sensing mode is a dual-electrode, sensing mode. In another embodiment, the self-capacitance sensing mode is a dual-channel or a differential channel single-ended sensing mode, and the mutual capacitance sensing mode is a dual-channel or a differential channel sensing mode. In one embodiment, a capacitance sensing circuit can sense capacitance in the multiple modes using a single current conveyor, for example, in the self-capacitance and mutual capacitance single-ended sensing modes. In another embodiment, the capacitance sensing circuit may include two current conveyors for sensing capacitance in either a dual-channel or a differential single-ended self-capacitance sensing mode, or in either a dual-channel or a differential channel mutual capacitance sensing mode. In yet another embodiment, the capacitance sensing circuit, when operating in either a dual-channel or a differential channel mutual capacitance sensing mode, supports voltage or current inputs.

Figure 1A:
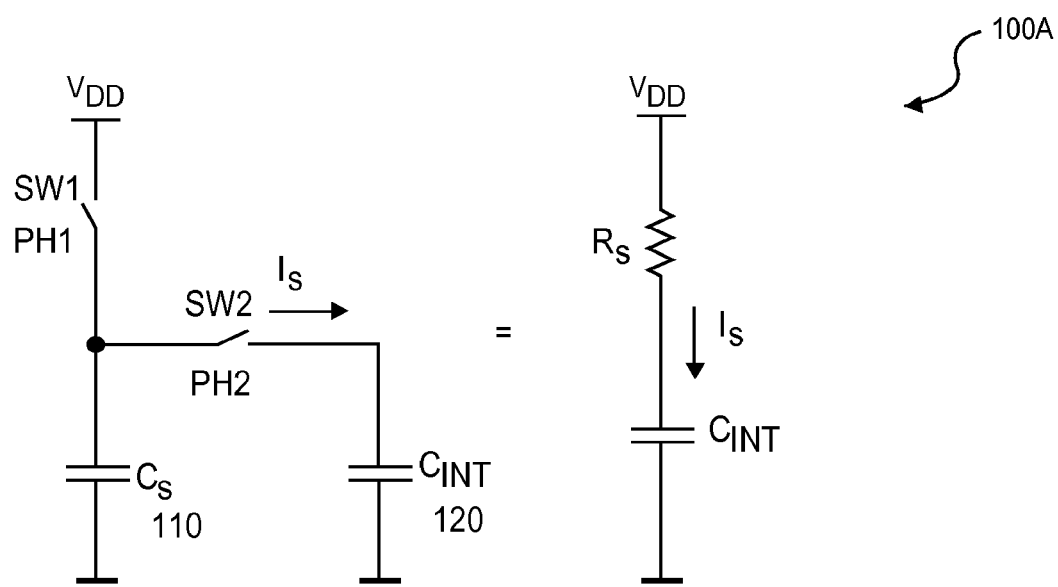
FIG. 1A illustrates a capacitance sensing circuit for sensing capacitance of $C_S$ in a self-capacitance sensing mode using the charge accumulation operation sensing technique.

There are various circuit implementations that may be used for sensing capacitance on sensor elements. FIG. 1A illustrates a capacitance sensing circuit 100A for sensing capacitance of $C_S$ 110 in a self-capacitance sensing mode. The capacitance sensing circuit 100A uses a charge accumulation or charge transfer sensing scheme to measure the self-capacitance of the capacitor $C_S$ 110. The charge accumulation sensing scheme operates as follows: after resetting (i.e., discharging) the integration capacitor $C_{INT}$ 120, the switches SW1 and SW2 operate in two non-overlapping phases PH1 and PH2, which are repeated in cycles. During phase PH1, i.e., when the clock signal to the capacitance sensing circuit 100A is high, the switch SW1 is on and the switch SW2 is off. During phase PH2, i.e., when the clock signal to the capacitance sensing circuit 100A is low, the switch SW2 is on and the switch SW1 is off. The switches SW1 and SW2 are not on at the same time. Thus, the sensing capacitor $C_S$ 110 is charged to the supply voltage $V_{DD}$ during phase PH1 and is discharged to the integration capacitor $C_{INT}$ 120 during phase PH2. The self-capacitance sensed on $C_S$ 110 may be determined by the number of switching cycles used to get the integration capacitor $C_{INT}$ 120 to a certain threshold value or by measuring the voltage on the integration capacitor $C_{INT}$ 120 after executing predefined number of cycles.

With such a charge accumulation technique, the voltage on the integration capacitor $C_{INT}$ 120 rises exponentially with respect to time (which can be measured by the cycle count). The relationship between the voltage on the integration capacitor $C_{INT}$ 120 and the cycle count can be linearized for measurement methods where capacitance is calculated as a function of the voltage present on the integration capacitor after a predefined number of cycles.

The charge accumulation technique either converts the sensed capacitance to the time interval or voltage. Another self-capacitance sensing circuit, shown in FIG. 1B, uses the sigma-delta modulator to convert the sensed capacitance to the bit stream density.

There are several possible implementations of how the sigma-delta modulation technique may be used for the capacitance sensing, a couple of possible examples are described in U.S. Patent Publication No. 2008/0111714, filed Nov. 14, 2006, and commonly assigned to the assignee of the present application.

Figure 1B:
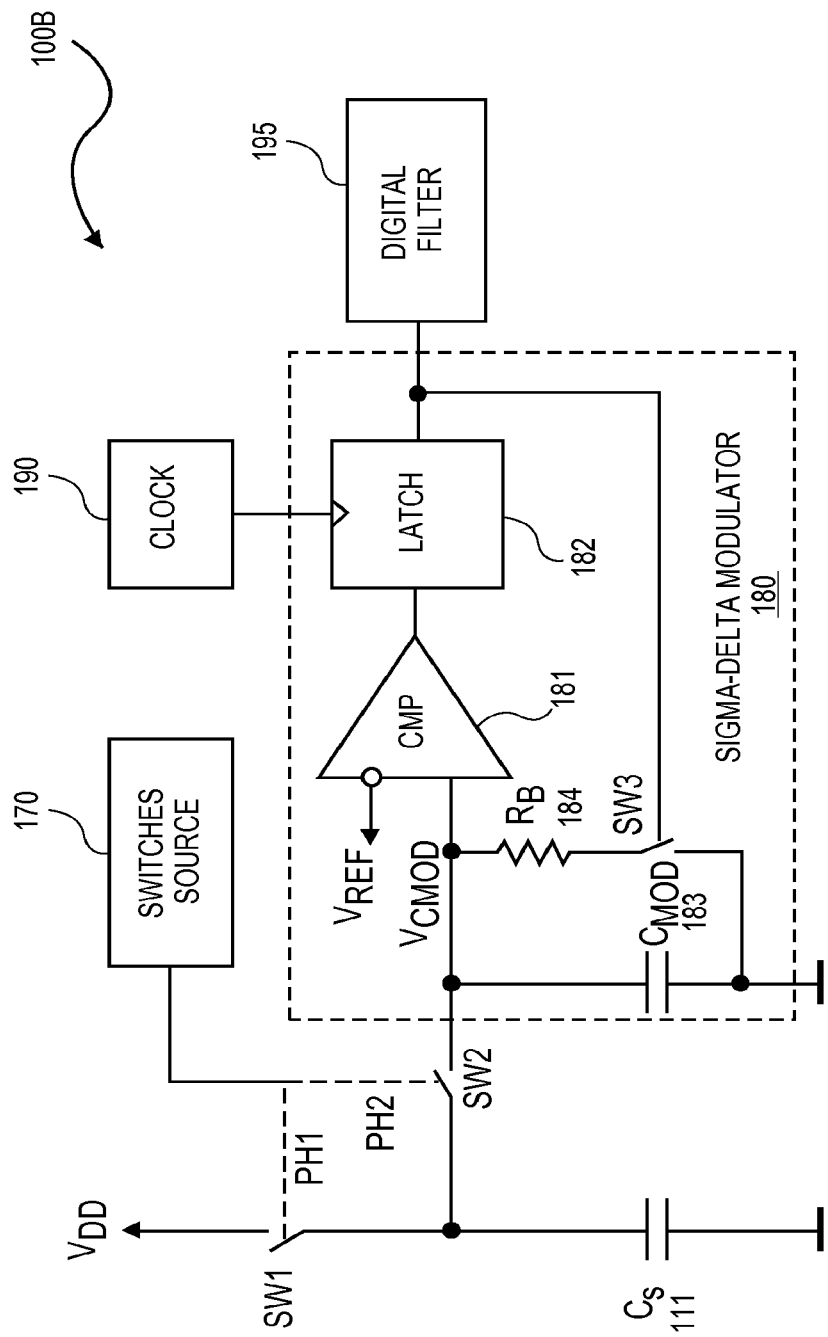
FIG. 1B illustrates a capacitance-sensing circuit for sensing capacitance of Cs in a self-capacitance sensing mode using a sigma-delta modulator sensing technique.

FIG. 1B illustrates a capacitance-sensing circuit 100B for sensing the capacitance of $C_S$ 111 in a self-capacitance sensing mode using the sigma-delta modulator sensing technique. In FIG. 1B, the switches SW1 and SW2 operate in two non-overlapping phases, PH1 and PH2, via the switches source 170. At phase PH1 (when clock signal is high), SW1 is on. At phase PH2 (when clock signal is low), SW2 is on. SW1 and SW2 are not on at the same time. The sensing capacitor Cs 111 is charged to the supply voltage $V_{DD}$ during phase PH1 and is discharged to the modulator capacitor $C_{MOD}$ 183 during phase PH2.

The sigma-delta modulator 180 includes a comparator 181, a latch 182, a modulation capacitor $C_{MOD}$ 183, and a discharge resistor $R_B$ 184. When the modulation capacitor voltage $V_{CMOD}$ reaches the comparator reference voltage $V_{REF}$, the comparator 181 toggles and, following a delay period provided by latch 182, enables the capacitor discharge resistor $R_B$ when SW3 is on. As a result of the charge removed from $C_{MOD}$ 183 through $R_B$ 184, the voltage of the modulation capacitor $C_{MOD}$ 183 starts dropping. When the voltage of the modulation capacitor $C_{MOD}$ 183 falls below the reference voltage $V_{REF}$, the comparator 181 toggles and, following a delay period provided by latch 182, SW3 is off preventing the discharge of $C_{MOD}$ 183 through resistor $R_B$ 184. Thus, the modulation capacitor $C_{MOD}$ 183 starts rising again, repeating the modulation capacitor $C_{MOD}$ 183 charge/discharge cycles. The latch 182 makes comparator operation synchronous to the clock 190 and limits minimum discharge switch SW3 on/off time. The sigma-delta modulator 180 keeps the average modulation capacitor voltage $V_{CMOD}$ close to the reference voltage $V_{REF}$ by alternatively turning on/off the discharge switch SW3.

Figure 2:
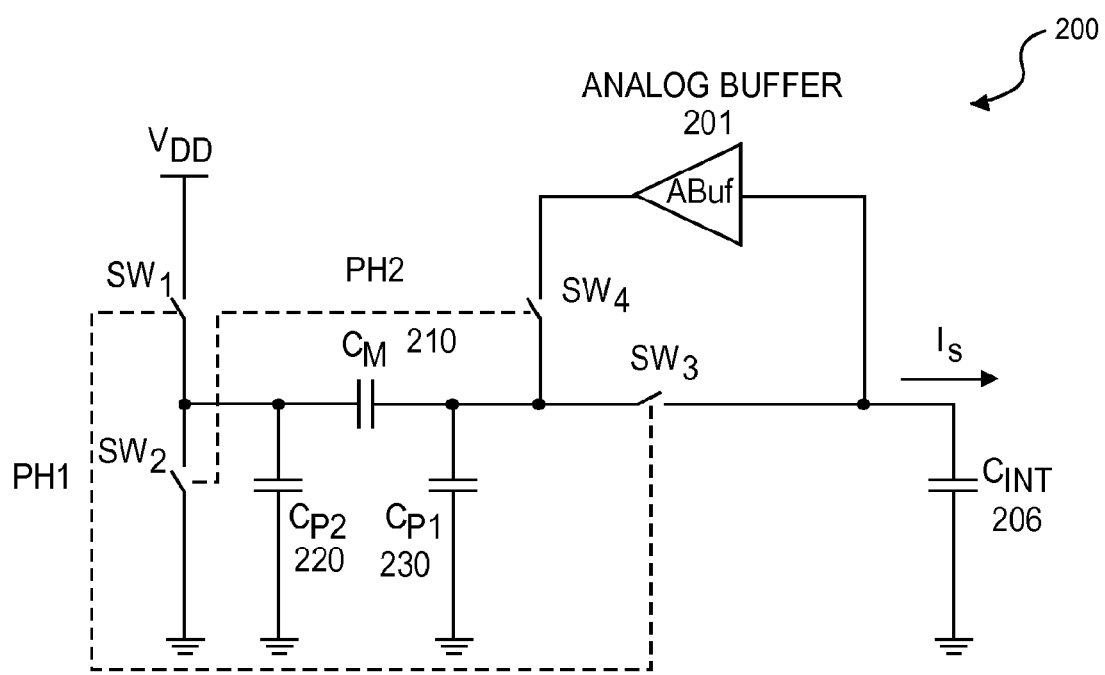
FIG. 2 illustrates a capacitance-sensing circuit for sensing mutual capacitance in a mutual capacitance sensing mode.

FIG. 2 illustrates a capacitance sensing circuit 200 for sensing mutual capacitance of the capacitor $C_M$ 210 in a mutual capacitance (transmitter-receiver or TX-RX) sensing mode. The capacitor $C_{P1}$ 230 and $C_{P2}$ 220 represent the parasitic capacitances of two sensor elements. The capacitance sensing circuit 200 may operate using two non-overlapping phases: PH1 and PH2, which cycle repeatedly. During PH1, the switches SW1 and SW3 are turned on, while during PH2, the switches SW2 and SW4 are turned on. The switches SW1 and SW2 function as a transmitter driver that charges the capacitor $C_M$ 210 during PH1 when SW1 and SW3 are turned on and discharges the capacitor $C_M$ 210 during PH2 when SW2 and SW4 are turned on.

The switches SW3 and SW4 function as current demodulation receiver switches. The analog buffer 201 keeps the receiver electrode potential approximately the same during both PH1 and PH2 operation phases, shielding the circuit 200 from the $C_{P1}$ parasitic capacitance change. It should be noted that the integration capacitor $C_{INT}$ 206 is considered part of the capacitance sensing circuit 200 and is shown here for ease of explanation. During PH1, i.e., the charge cycle, the voltage potential for the capacitor Cm 210 is $V_{CM}=V_{DD}-V_{CINT}$, the voltage potential for the parasitic capacitors $C_{P1}$ 230 and $C_{P2}$ 220 are $V_{CP1}=V_{CINT}$, $V_{CP2}=V_{DD}$. During PH2, i.e., the discharge cycle, the voltage potential for the capacitor $C_M$ 210 is $V_{CM}=V_{ABUF}=V_{CINT}=V_{CP1}$.

As discussed above, the capacitance sensing circuits 100A and 100B can only operate in a self-capacitance sensing mode and the capacitance sensing circuit 200 can only operate in a mutual capacitance sensing mode. The capacitance sensing circuits 100A, 100B, and 200 have variable input impedance at different operation phases, which causes possible parasitic external noise signal demodulation. For example, when none of the switches in a capacitance sensing circuit, such as the capacitance sensing circuit 100A, 100B, or 200, is turned on, the capacitance sensing circuit has high-impedance. It is supposed in the dead time no one switch is turned on. During this time the circuit is high-impedance circuit. If the very high-frequency RF noise (e.g. 1 GHz signal, with periods comparable with dead time) with sufficient amplitude is applied during dead time, the body diode could turn on and analog multiplexer starts conduct, causing the false capacitance sense system operation. If input circuit is low impedance input circuit all time, there is much less chances that RF noise could affect system operation.

Furthermore, the capacitance sensing circuits 100A, 100B, and 200 typically only provide half-wave rectification and demodulation of the sensing current, resulting in the low-frequency noise immunity degradation, especially noise from AC power, such as the high-amplitude noise at 110-230 V at 50/60 Hz. The term half-wave rectification and demodulation means that the circuit multiplies the noise signal, applied to $C_S$ by factor 1 when $C_S$ is connected with $C_{MOS}$ and by factor 0 when $C_S$ is connected to power supply. So, the noise signal comes to the following modulator/integration circuits without proper mixing up and suppressing by the integration circuit low-pass filter nature. The full-wave circuit multiples noise signal by factor ±1, mixing up it and suppressing the integration circuit filter. Noise may also be coupled from AC-DC power supplies, such as from AC-DC switching power converters having noise between 40 kHz and 3 MHz, depending on the switching power supply regulator. The main benefit of using full-wave demodulation is in the much better suppression of the AC noise and better suppression of the noise from switching regulators.

Furthermore, the above-mentioned circuits may be configured to sense the capacitance only in one self-capacitance (single-electrode) sensing mode or mutual capacitance (dual-electrode) sensing mode. Having a circuit with the ability to sense capacitance in both modes may provide some benefits, such as by improving the water rejection possibilities and touch coordinate resolution.

Figure 3A:
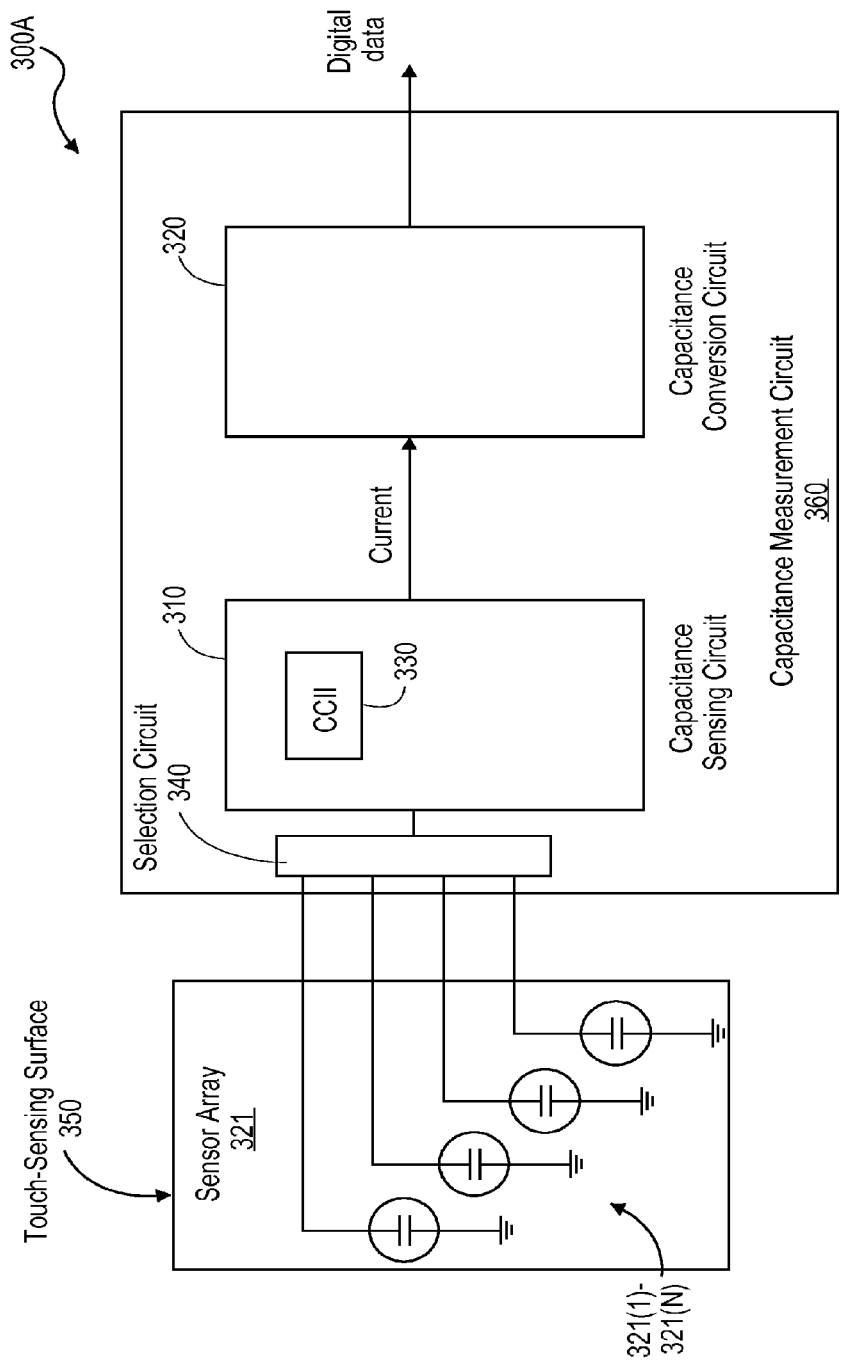
FIG. 3A illustrates a block diagram of one embodiment of an electrical circuit having a capacitance measurement circuit for sensing capacitances on a touch-sensing surface using multiple sensor elements of a sensor array in a self-capacitance sensing mode.

FIG. 3A illustrates a block diagram of one embodiment of an electrical circuit 300A having a capacitance measurement circuit for sensing capacitances on a touch-sensing surface using multiple sensor elements of a sensor array in a self-capacitance sensing mode. The electrical circuit 300A includes a capacitance measurement circuit 360 and a touch-sensing surface 350 (e.g., array of buttons, sliders, a touch screen, a touch pad).

The capacitance measurement circuit 360 includes a selection circuit 340, a capacitance sensing circuit 310, and a capacitance conversion circuit 320. The touch-sensing surface 350 may be coupled to the capacitance measurement circuit 360 via the selection circuit 340 (e.g., multiplexer). The selection circuit 340 allows the capacitance sensing circuit 310 to sense the capacitance on multiple sensor elements 321(1)-321(N). It is understood that the touch-sensing surface 350 may be coupled to one or more capacitance measurement circuits 360 via other means, e.g., one or more multiplexers, or without any multiplexers, as would be appreciated by one of ordinary skill in the art having the benefit of this disclosure. The capacitance sensing circuit 310 senses the self-capacitance of one or more sensor elements of the touch-sensing surface 350 in a single-ended, self-capacitance sensing mode by converting the sensed capacitance to current pulses. The capacitance conversion circuit 320, coupled to the capacitance sensing circuit 310, receives the current pulses input from the capacitance sensing circuit 310 and converts the current pulses into readable digital data.

In FIG. 3A, the touch-sensing surface 350 is a two-dimensional user interface that uses a sensor array 321 to detect capacitance on the touch-sensing surface 350 in a self-capacitance sensing mode. In one embodiment, the sensor array 321 includes sensor elements 321(1)-321(N) (where N is a positive integer) that are disposed as a two-dimensional matrix (also referred to as an XY matrix). It should be noted that the sensor array 321 depicts four sensor elements; however, in other embodiments, the sensor array 321 may include any number of sensor elements. The sensor elements 321(1)-321(N) are conductors that are coupled to the capacitance sensing circuit 310 of the capacitance measurement circuit 360 via the selection circuit 340. The conductors may be metal, or alternatively, the conductors may be conductive ink (e.g., carbon ink), conductive ceramic (e.g., transparent conductors of indium tin oxide (ITO)), conductive polymers, or the like. In FIG. 3A, each sensor element 321(1)-321(N) is represented as a capacitor. The capacitance sensing circuit 310 includes at least one current conveyor 330. In one embodiment, the current conveyor 330 is a second generation current conveyor (CCII) implemented by CMOS technology, such as illustrated in FIG. 5B.

Although FIG. 3A describes the electrical circuit 300A having the capacitance measurement circuit 360 and the touch-sensing surface 350, in other embodiments, the capacitance measurement circuit may be implemented in other non-contact capacitance sensing devices that use proximity detection, which may not have a touch-sensing surface, as would be appreciated by one of ordinary skill in the art having the benefit of this disclosure.

Figure 3B:
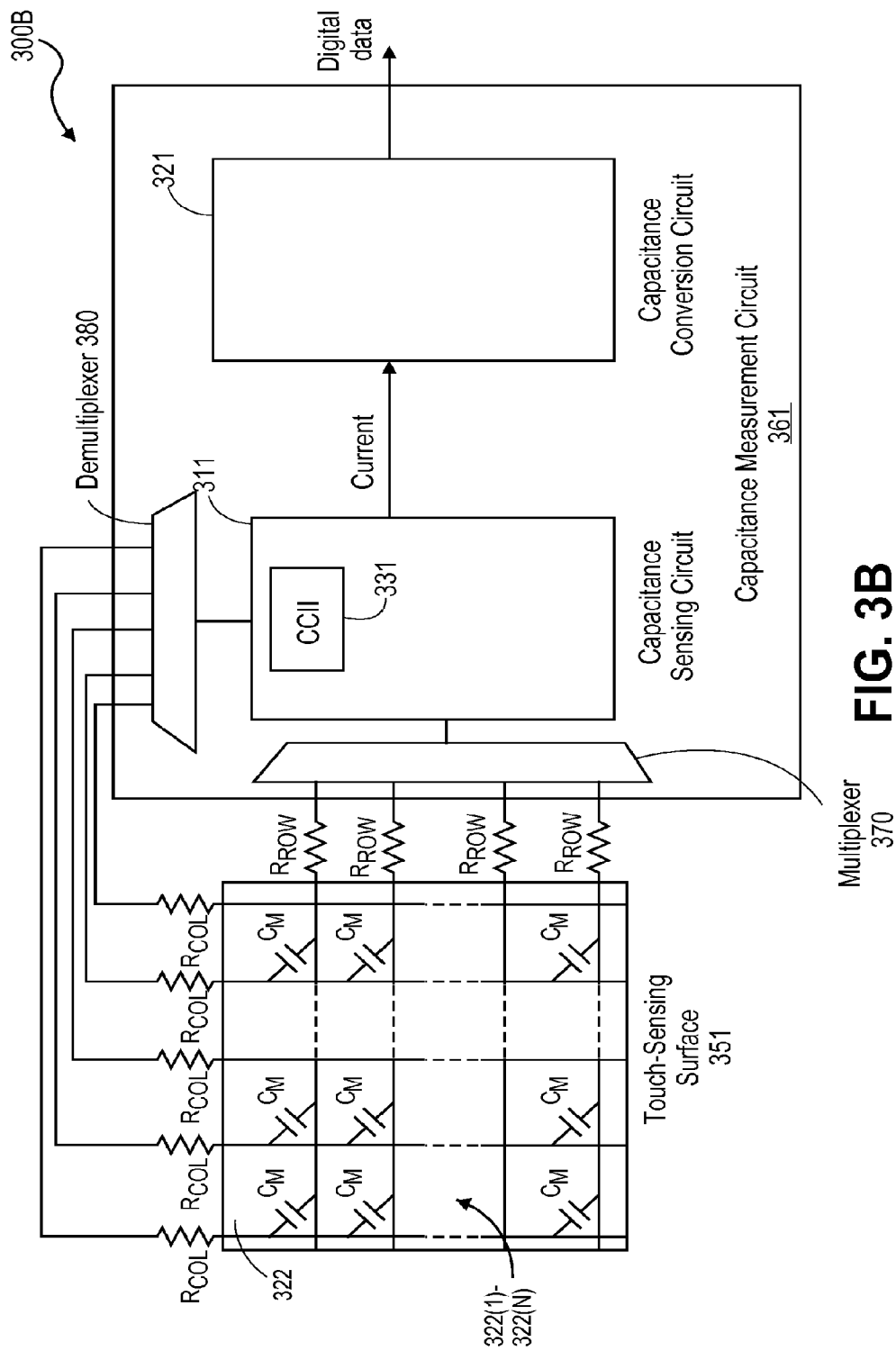
FIG. 3B illustrates a block diagram of another embodiment of an electrical circuit having a mutual capacitance measurement circuit for sensing capacitance on a touch-sensing surface using multiple sensor elements of a sensor array in a mutual capacitance sensing mode.

FIG. 3B illustrates a block diagram of one embodiment of an electrical circuit 300B having a mutual capacitance measurement circuit for sensing capacitances on a touch-sensing surface using multiple sensor elements of a sensor array in a mutual capacitance sensing mode. The electrical circuit 300B includes a capacitance measurement circuit 361 and a touch-sensing surface 351 (e.g., of a touch screen, a touch pad).

The capacitance measurement circuit 361 includes a multiplexer 370 and a demultiplexer 380, a capacitance sensing circuit 311, and a capacitance conversion circuit 321. The touch-sensing surface 351 is coupled to the capacitance measurement circuit 361 via the multiplexer 370 and the demultiplexer 380. Although FIG. 3B shows the row sensor elements of the sensor array 322 are connected to the multiplexer 370 and the column sensor elements of the sensor array 322 are connected to the demultiplexer 380, alternatively, the row sensor elements of the sensor array 322 may be connected to the demultiplexer 380 and the column sensor elements of the sensor array 322 may be connected to the multiplexer 370, as would be appreciated by one of ordinary skill in the art having the benefit of this disclosure. It is also understood that the touch-sensing surface 351 could be coupled to the one or more capacitance measurement circuits 361 via other means, e.g., one multiplexer or more than two multiplexers, or without any multiplexers, as would be appreciated by one of ordinary skill in the art having the benefit of this disclosure. For example, one multiplexer may be used for the TX lines and the RX lines are connected to the receiver channels directly without a multiplexer or demultiplexer. The capacitance sensing circuit 311 senses the mutual capacitance formed between two sensor elements, which are located in an intersecting row and column of the touch-sensing surface 351, in a mutual capacitance sensing mode by converting the sensed mutual capacitance to current pulses. The capacitance conversion circuit 321, coupled to the capacitance sensing circuit 311, receives the current pulses input from the capacitance sensing circuit 311 and converts the current pulses into readable digital data.

In the embodiment shown in FIG. 3B, the touch-sensing surface 351 is a two-dimensional user interface that uses the capacitance measurement circuit 361 to detect mutual capacitance on the touch-sensing surface 351. The sensor array 322 includes sensor elements 322(1)-322(N) (where N is a positive integer) that are disposed in rows and columns. In one embodiment, the touch-sensing surface 351 uses ITO to form the electrically conductive sensor elements. Alternatively, other touch-sensing surfaces having other electrically conductive sensor elements may be used as would be appreciated by one of ordinary skill in the art having the benefit of this disclosure. It should be noted that the sensor array 322 depicts sensor elements 322(1)-322(N) disposed in 4 rows and 5 columns in FIG. 3B; however, in other embodiments, the sensor array 322 may include any number of sensor elements that are disposed in any number of rows and columns. Although FIG. 3B describes the electrical circuit 300B having the capacitance measurement circuit 361 and the touch-sensing surface 351, in other embodiments, the capacitance measurement circuit may be implemented in other non-contact capacitance sensing devices that use proximity detection, which may not have a direct touch-sensing surface, as would be appreciated by one of ordinary skill in the art having the benefit of this disclosure.

The sensor elements 322(1)-322(N) are conductors that are coupled to the capacitance sensing circuit 311 of the capacitance measurement circuit 361 via the multiplexer 370 and the demultiplexer 380. The conductors may be metal, or alternatively, the conductors may be conductive ink (e.g., carbon ink), conductive ceramic (e.g., transparent conductors of ITO), conductive polymers, or the like.

In FIG. 3B, the mutual capacitance $C_M$ is formed by electric field between two conductive objects, i.e., two sensor elements, one acting as a signal receiver and the other acting as a transmitter, in which some portion of the current passing through one passes into the other. As shown, the mutual capacitance $C_M$ occurs between two sensor elements that are located at the intersection of each row and column of the touch sensing surface 351. As a conductive object, such as a finger, presses down on a touch-sensing surface, the mutual capacitance formed between a receiver sensor element and a transmitter sensor element is decreased because the conductive object shunts part of the electric field to the ground. Although the parasitic capacitances of the receiver sensor element and the transmitter sensor element are increased at the same time the mutual capacitance decreases, the change of the parasitic capacitances should not affect the mutual capacitance sensing when the potential of the receiver sensor element is kept constant, which could be achieved when the capacitance sensing circuit receives current inputs.

The aforementioned circuits from FIG. 1A, FIG. 1B, and FIG. 2 use the switching capacitor sensing principle. There is possible to build the capacitance sensing circuits, using the current conveyer as primary building block. There are several generation of the current conveyor circuits, this invention uses second generation of the current conveyor in one embodiment. In other embodiments, other generations of current conveyor circuits may be used.

Figure 5A:
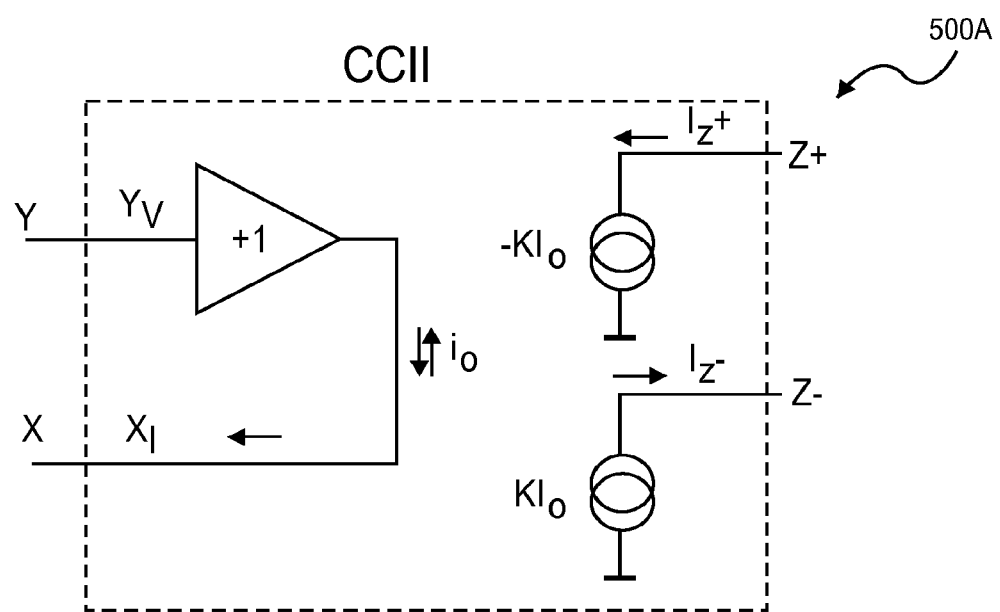
FIG. 5A illustrates an equivalent schematic of a second generation current conveyor (CCII), according to one embodiment.
Figure 5B:
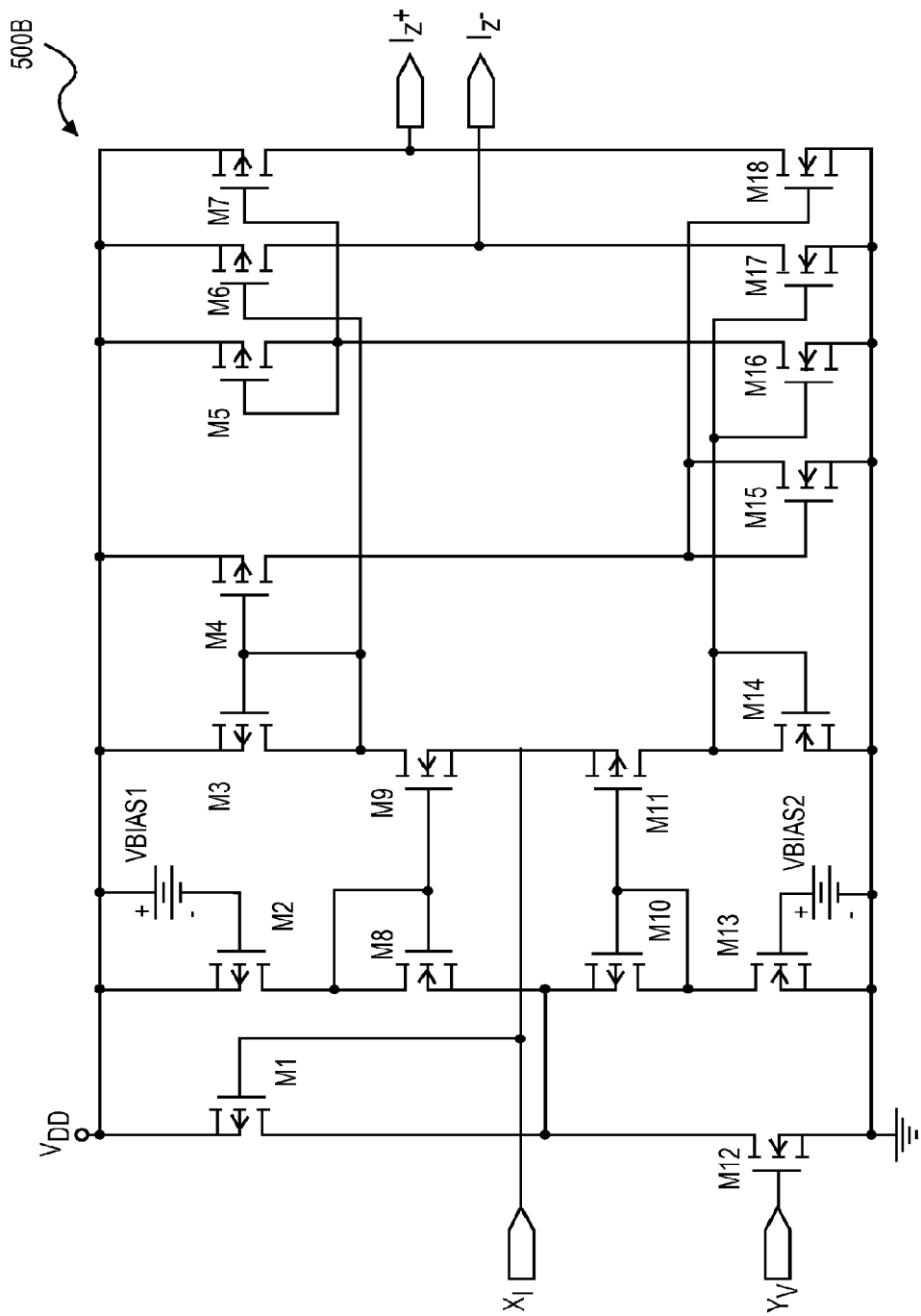
FIG. 5B illustrates a CMOS implementation of a second generation current conveyor, according to one embodiment.

FIG. 5A illustrates a simplified schematic of a second generation current conveyor (CCII) 500A, according to one embodiment. The CCII 500A is a four-terminal device derived by interconnecting the voltage and the current followers. As shown in FIG. 5A, the four terminals of the CCII 500A include: the voltage input terminal $Y_V$, the current input terminal $X_I$, the current output terminal $I_{Z+}$, and the current output terminal $I_{Z-}$. The voltage input terminal $Y_V$ is a high-impedance terminal while the current input terminal $X_I$ is a low-impedance terminal. An input voltage ($V_Y$) applied to the voltage input terminal $Y_V$ may be conveyed to the voltage $V_X$ on the current input terminal $X_I$, i.e., $V_X=V_Y$. In addition, no current flows into the input terminal $Y_V$ as $Y_V$ is high impedance input.

An input current $I_0$ applied to the input terminal $X_I$ is conveyed to the output current $I_{Z+}$ at the output terminals $I_{Z+}$ and $I_{Z-}$. The output terminals $I_{Z+}$ and $I_{Z-}$ are used for balanced current outputs, i.e., Iz+=−Ix, Iz−=+Ix.

The implementation of the bipolar current output of the CCII 500A helps with noise rejection and may be used for quasi-differential channels building. The output terminals $I_{Z+}$ are high-impedance output terminals suitable for current output. The direction of the output current $I_Z$ is relative to the input current at the current input terminal $X_I$. The input-output relation of the CCII 500A may be described by the following matrix equation:

$$\begin{pmatrix} I_Y \\ V_X \\ I_{Z\mp} \end{pmatrix} \equiv \begin{pmatrix} 0 & 0 & 0 \\ 1 & 0 & 0 \\ 0 & \pm 1 & 0 \end{pmatrix} \begin{pmatrix} V_Y \\ I_X \\ V_Z \end{pmatrix}$$

Using the CCII 500A for sensing capacitance in multiple modes of the capacitance sensing circuit may provide the following benefits. First, the CCII has the low-impedance current input $X_I$, which may provide good immunity to high-impedance noise signals, such as RF or ESD. Second, the voltage potential of the current input $X_I$ is controlled by the high-impedance voltage input $Y_V$, allowing implementing optimal structures for multiple capacitance sensing modes (self capacitance sensing mode and mutual capacitance sensing mode). Third, the CCII 500A current outputs may be easily converted to measurable form by using charge integration/balancing circuits, such as a sigma-delta modulator or simple charge integration circuits. Finally, the CCII 500A has the ability of operating without an external closed loop, providing stability at different sensor parasitic capacitances. The current conveyors are widely used inside the analog and mixed signal ASIC for signal amplification, filtering and rectification analog signals multiplication and division, building the trans-impedance and trans-conductance amplifiers, wideband line drivers. There are only few discrete implementation of the CCII, called sometimes as ideal transistor. e.g., the OPA860/861 from Texas Instruments.

In one embodiment, the CCII 500A may be an operational amplifier based architecture that uses a closed loop system. In another embodiment, the CCII 500A may use the translinear principle that uses an open loop architecture. Alternatively, other implementations of current conveyors may be used for sensing capacitance as would be appreciated by one of the ordinary skill in the art having the benefit of this disclosure.

FIG. 5B illustrates a CMOS implementation of a second generation current conveyor (CCII) 500B implemented by translinear principle, according to one embodiment. The CCII 500B includes an input stage (transistors M1 and M12), a current bias sources stage (transistors M2 and M13), a voltage follower stage (transistors M8 through M11), multi output current mirrors M3-M4, M6, M14, M16, M17, and current mirrors M5, M7 and M15, M18. The voltage follower stage is represented by the transistors M8 through M11 forming a translinear loop stage. The current mirrors are used to convey the current passing through to the input terminal $X_I$ to the output terminals $I_{Z+}$ and $I_{Z-}$. The CCII 500B may be implemented in the 0.35 µm CMOS process. Alternatively, the CCII may be implemented using other CMOS or bipolar processes, as well as using other configurations for the CCII as would be appreciated by one of ordinary skill in the art having the benefit of this disclosure.

Figure 4A:
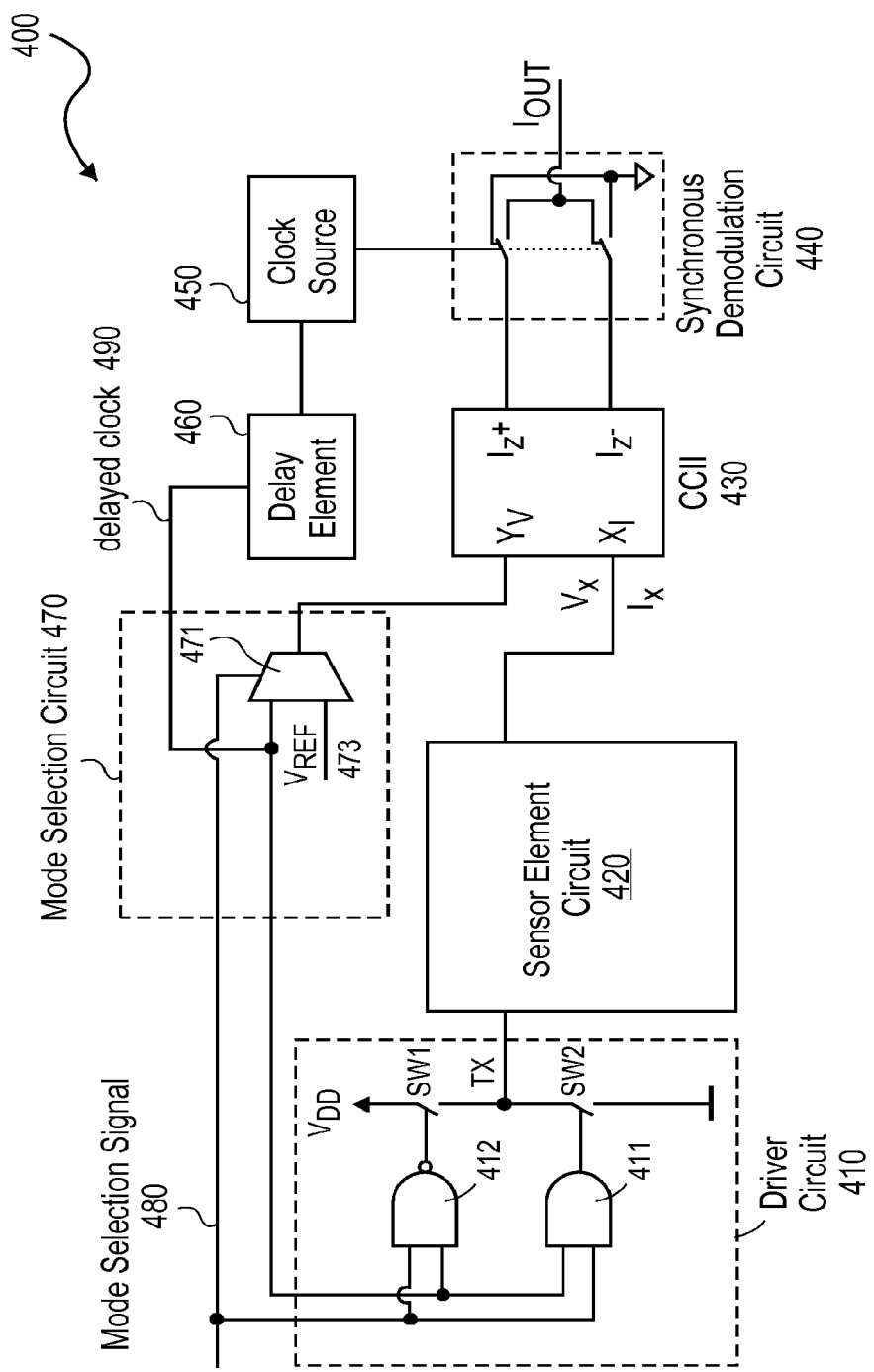
FIG. 4A illustrates a capacitance sensing circuit for measuring capacitance of sensor elements in either a self-capacitance sensing mode or a mutual capacitance sensing mode, according to one embodiment.

FIG. 4A illustrates a capacitance sensing circuit 400 for sensing capacitance of one or more sensor elements in either a self-capacitance (single-electrode) sensing mode or a mutual capacitance sensing mode, according to one embodiment. The capacitance sensing circuit 400 includes a driver circuit 410 for sensing mutual capacitance, a sensor element circuit 420, a CCII 430, a synchronous demodulation circuit 440, a clock source 450, a delay element 460, and a signal selection circuit 470. The CCII 430 generates balanced current outputs (Iz+, Iz−), which are used as inputs for the demodulation circuit 440. In one embodiment, the synchronous demodulation circuit 440 is a full-wave synchronous demodulation circuit. Alternatively, other synchronous demodulation circuits could be used for the capacitance sensing circuit 400, as would be appreciated by one of ordinary skill in the art having the benefit of this disclosure.

In one embodiment, the multiple capacitance sensing modes include a self-capacitance (single-electrode, single-ended) sensing mode and a mutual capacitance sensing mode. In one embodiment, the capacitance sensing circuit 400 may be switched between a self-capacitance sensing mode and a mutual capacitance sensing mode using the mode selection signal 480.

The clock source 450 generates a clock signal for the synchronous demodulation circuit 440, the mode selection circuit 470, and the driver circuit 410. In one embodiment, the clock source 450 is a spread spectrum clock source. The delay element 460 is used to delay the clock signal generated by the clock source 450 to make sure that the delayed clock signal 490 is applied to the signal selection circuit 470 and the driver circuit 410, after the synchronous demodulation circuit 440 is switched to accept proper input current polarity. The capacitance sensing circuit 400 acts as differentiator network, forming the largest peak current values immediately after rising and falling edge of the TX signal, taking into account finite on/off switching time the synchronous demodulation circuit 440 is needed prior to the edge of the TX signal. Alternatively, the capacitance sensing circuit 400 does not include the delay element 460.

In FIG. 4A, the mode selection circuit 470 is a multiplexer 471 having two inputs: the delayed clock 490 and a reference voltage $V_{REF}$ 473. The mode selection signal 480 functions as a selection line for the multiplexer 471. The output of the multiplexer 471 is coupled to the input terminal $Y_V$, i.e., the voltage input of the CCII 430. The input terminal $X_I$, i.e., the current input, of the CCII 430 is coupled to a terminal of the sensor element circuit 420, e.g., one terminal of the capacitor ($C_M$) to be measured. The balanced outputs (Iz+, Iz−) of the CCII 430 are coupled to the synchronous demodulation circuit 440, which in turn generates a current output $I_{OUT}$. In another embodiment, other selection circuits may be used to switch between the sensing modes, for example, a logic state machine. Various techniques for the synchronous detector output current measurement could be used, e.g., the techniques of converting current in the voltage using the resistive circuits with following filtering, integrating current and charge time measurement, and supplying current to the sigma-delta modulator circuits and convert it to the bit-steam density.

The driver circuit 410 includes an AND gate 411, a NAND gate 412, switches SW1 and SW2, and a voltage source $V_{DD}$. The driver circuit 410 may be used to charge and discharge the capacitors in the sensor element circuit 420. The charge and discharge are repeated in cycles. During the charge cycle, the switch SW1 of the driver circuit 410 is turned on and the switch SW2 of the driver circuit 410 is turned off. The switch SW1 is controlled by the output of the NAND gate 412 and the switch SW2 is controlled by the output of the AND gate 411. The timing of the switching of SW1 and SW2 are controlled so as to prevent any interval where both SW1 and SW2 are closed at the same time. One input of each of the AND gate 411 and the NAND gate 412 is coupled to the mode selection signal 480 and another input of each of the AND gate 411 and the NAND gate 412 is coupled to the delayed clock 490. Alternatively, the driver circuit 410 may include other circuit components than those illustrated in FIG. 4A, as would be appreciated by one of ordinary skill in the art having the benefit of this disclosure.

Figure 6:
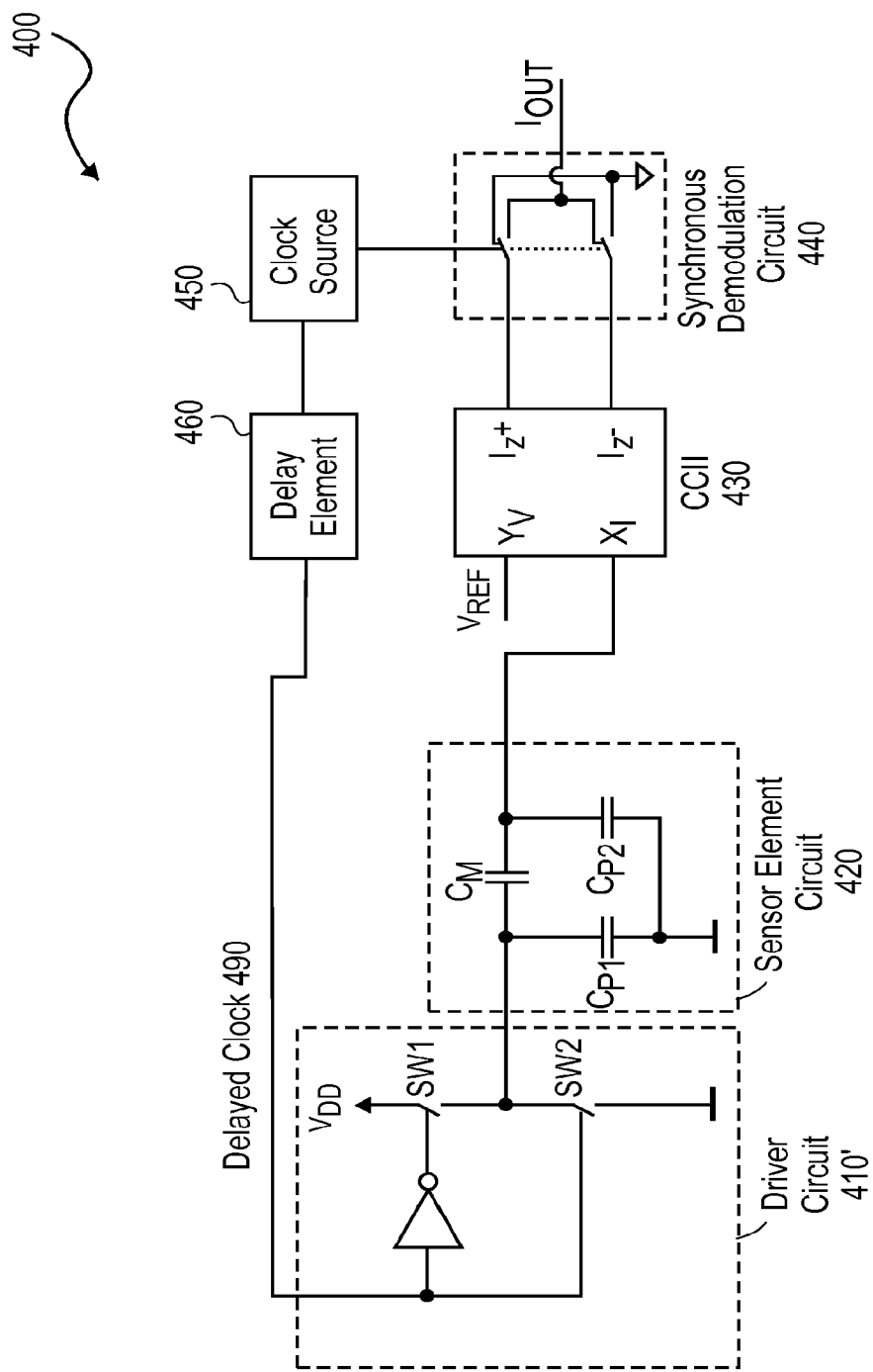
FIG. 6 illustrates the functional elements of capacitance sensing circuit of FIG. 4A for measuring capacitance of sensor elements in the mutual capacitance sensing mode, according to one embodiment.
Figure 7:
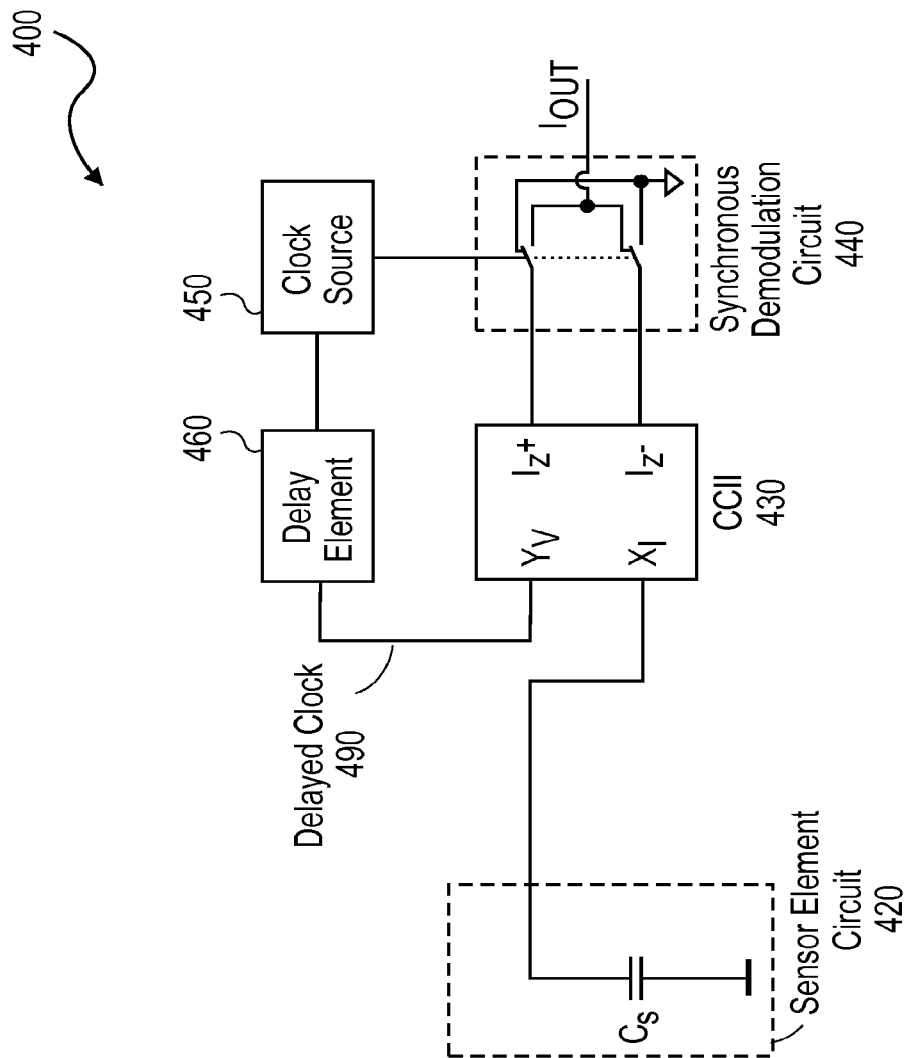
FIG. 7 illustrates the functional elements of capacitance sensing circuit of FIG. 4A for measuring capacitance of sensor elements in a single-ended, self-capacitance sensing mode, according to one embodiment.

The sensor element circuit 420 may include one or more sensor elements. In one embodiment, when the circuit 400 operates in a self-capacitance sensing mode, the sensor element circuit 420 may include one sensor element with a sensing capacitor Cs (as shown in FIG. 7). In another embodiment, when the circuit 400 operates in a mutual capacitance sensing mode, the sensor element circuit 420 may include two sensor elements as a mutual capacitor $C_M$ along with two parasitic capacitors $C_{P1}$ and $C_{P2}$ (as shown in FIG. 6) are formed between those two sensor elements that are located in an adjacent intersection of a row and a column of a sensor array. Alternatively, the sensor elements circuits 420 may include more than two sensor elements, as would be appreciated by one of ordinary skill in the art having the benefit of this disclosure.

Figure 4B:
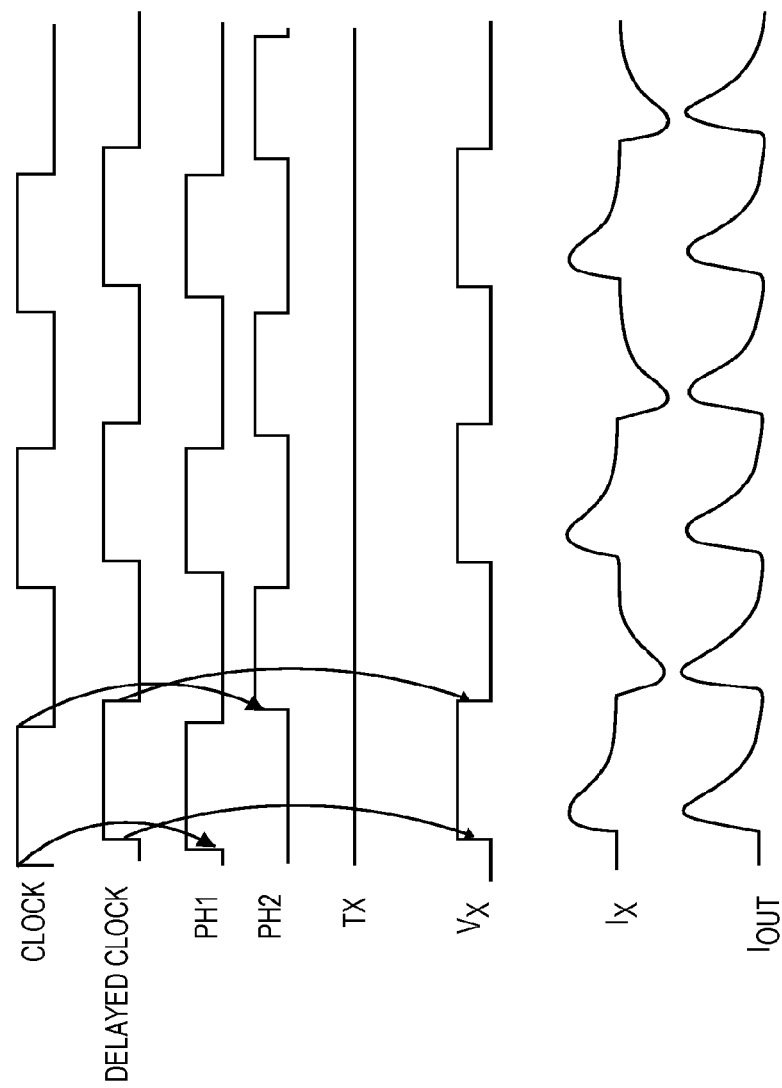
FIGS. 4B-C illustrate the operation waveforms of the capacitance sensing circuit of FIG. 4A for measuring capacitance of sensor elements in a self-capacitance sensing mode and a mutual capacitance sensing mode, respectively, according to embodiments.
Figure 4C:
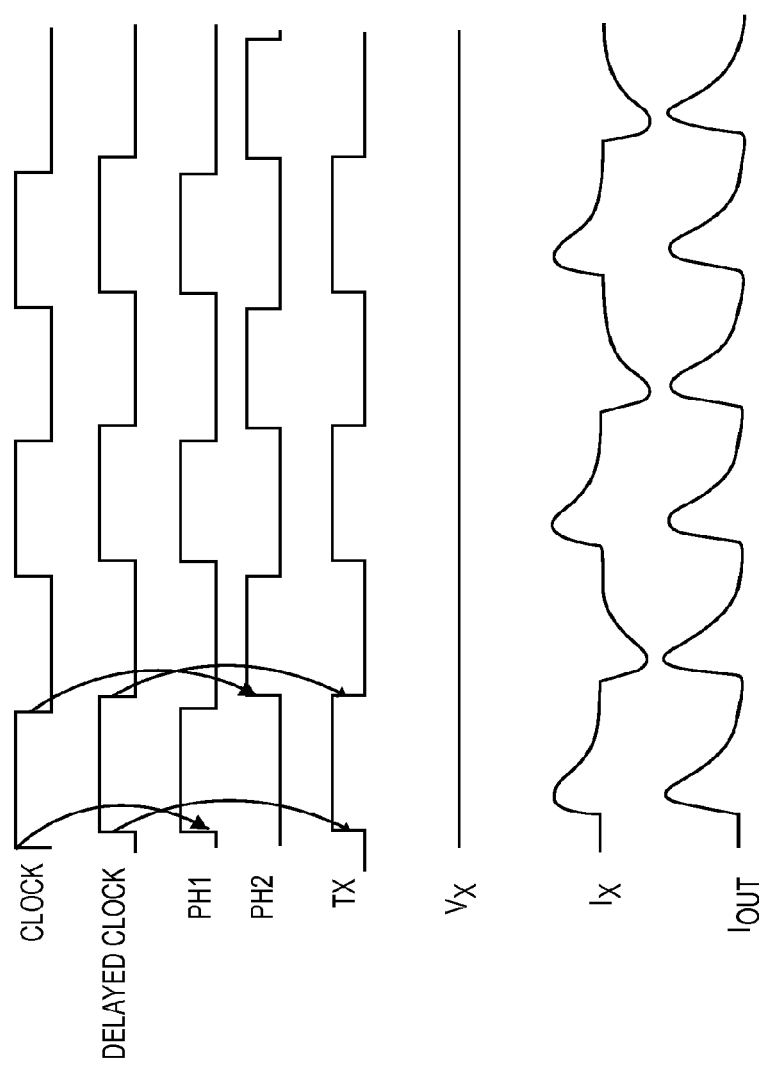

FIGS. 4B-C illustrate the operation waveforms of the capacitance sensing circuit of FIG. 4A for measuring capacitance of sensor elements in a self-capacitance sensing mode and a mutual capacitance sensing mode respectively, according to embodiments. As shown in FIG. 4B, in the self-capacitance sensing mode, the CCII 430 voltage input reference $Y_V$ is not kept constant, which is because the driver circuit 410 is disabled in the self capacitance sensing mode; therefore, the sensor element circuit 420 is driven and sensed through the $X_I$ current pin of the CCII 430. As shown in FIG. 4C, in the mutual capacitance sensing mode, the CCII 430 voltage input reference $Y_V$ is kept constant at $V_{REF}$, which is because the driver circuit 410 is enabled to drive the sensor element circuit 420 in the mutual capacitance sensing mode.

FIG. 6 illustrates the capacitance sensing circuit 400 of FIG. 4A when configured to operate in a mutual capacitance sensing mode, according to one embodiment. As discussed above, the capacitance sensing circuit 400 shown in FIG. 4A may sense capacitance for one or more sensor elements in multiple sensing modes, one of which is a mutual capacitance sensing mode. It should be noted that scanning multiple sensor elements could be done using multiple parallel channels or scanning sensor elements in series using analog switches. FIG. 6 shows a simplified form of the capacitance sensing circuit 400 of FIG. 4A when the mutual capacitance sensing mode is selected via the signal selection circuit 470, e.g., via the mode selection signal 480, in FIG. 4A. As shown in FIG. 4A, when the mode selection signal 480 indicates to the signal selection circuit 470 to operate in a mutual capacitance sensing mode, the multiplexer 471 of the signal selection circuit 470 will select the constant reference voltage $V_{REF}$ as its output. As a result, as shown in FIG. 6, the $V_{REF}$ is coupled to the voltage input terminal $Y_V$ of the CCII 430, and the delayed clock 490, generated from the clock source 450 via the delay element 460, is coupled to the driver circuit 410'. The driver circuit 410' is equivalent to the driver circuit 410 in FIG. 4A when the mutual capacitance sensing mode is selected, e.g., the mode selection signal is set to logic high. Because the voltage input terminal $Y_V$ of the CCII 430 is held at a constant potential $V_{REF}$, the CCII 430, acting as a current amplifier, receives a current input from the sensor element circuit 420 and generates a current output for the synchronous demodulation circuit 440.

As shown in FIG. 6, the sensor element circuit 420 includes the mutual capacitor $C_M$ and two parasitic capacitors $C_{P1}$ and $C_{P2}$. As described above, a mutual capacitor is formed between two sensor elements that are located at the intersection of each row and column of a touch-sensing surface. One terminal of the capacitor $C_M$ in the sensor element circuit 420 is coupled to the current input terminal $X_I$, i.e., the low impedance current input of the CCII 430, while the other terminal of the capacitor $C_M$ in the sensor element circuit 420 is coupled to the driver circuit 410'.

The driver circuit 410' charges and discharges the capacitor $C_M$ of the sensor element circuit 420, and the charge and discharge are repeated in cycles. During the charge cycle, the switch SW1 of the driver circuit 410' is closed and the switch SW2 of the driver circuit 410' is open. Because the terminal of the capacitor $C_M$, which is connected to the current input $X_I$ of the CCII 430, is fixed at the potential $V_{REF}$, due to the fact that $V_{REF}$ is connected to the voltage input $Y_V$ of the CCII 430, the capacitor $C_M$ in the sensor element circuit 420 is charged to have a voltage potential of the voltage difference between $V_{DD}$ and $V_{REF}$. During the discharge cycle, the switch SW2 of the driver circuit 410' is closed and switch SW1 of the driver circuit 410' is open. Accordingly, the capacitor $C_M$ is discharged to have a voltage potential of $-V_{REF}$, because the terminal of the capacitor $C_M$, which is connected to the current input $X_I$ of the CCII 430, is fixed at the potential $V_{REF}$. In one embodiment, as illustrated in FIG. 3B, a multiplexer 370 may be used to input signals from the sensor element circuit 420 to the CCII 430 and a demultiplexer 380 may be used to output signals from the driver circuit 410' to the sensor element circuit 420 when the circuit 400 operates in a mutual capacitance sensing mode.

FIG. 7 illustrates the capacitance sensing circuit 400 of FIG. 4A for sensing self capacitance of one or more sensor elements in a self-capacitance, single-ended sensing mode, according to one embodiment. As discussed above, the capacitance sensing circuit 400 shown in FIG. 4A may sense capacitance for one or more sensor elements in multiple sensing modes, one of which is a self-capacitance, single-ended sensing mode. FIG. 7 shows a simplified view of the capacitance sensing circuit 400 when the self capacitance, single-ended sensing mode is selected via the signal selection circuit 470 shown in FIG. 4A. In FIG. 4A, when the mode selection signal 480 indicates to the signal selection circuit 470 to operate in a self-capacitance, single-ended sensing mode, the multiplexer 471 of the signal selection circuit 470 will select the delayed clock 490 as its output, and the driver circuit 410 is disabled. As a result, as shown in FIG. 7, the delayed clock 490 is coupled to the voltage input terminal $Y_V$ of the CCII 430. Thus, the CCII 430, keeping the voltage potential of the low-impedance current input terminal $X_I$ the same as that of the voltage input terminal $Y_V$, functions as a driver circuit to the sensor element circuit 420, and converts the charge and discharge currents of the sensor element circuit 420 to the balanced outputs Iz+ and Iz−. In one embodiment, as illustrated in FIG. 3A, a selection circuit 340 may be used to input and output signals between the sensor element circuit 420 and the CCII 430 when the circuit 400 operates in a self-capacitance sensing mode.

The implementation of the CCII 430 of FIG. 4A in a capacitance sensing circuit makes the electrode impedance of the sensor element circuit 420 constantly low during all operation phases and different sensing modes, and requires one charge and one discharge cycle for each operation period, allowing the capacitance sensing circuit 400 to operate at twice the frequency than previously known four-phase or multi-phase circuits. The ability to sense both sensor element charge and discharge current allows the output current within a given time window to be doubled, resulting in smaller number of charge/discharge cycles and improving signal-to-noise ratio.

The capacitance sensing circuits 400, 600, and 700 shown in FIGS. 4A, 6, and 7 respectively, may be used to implement one channel capacitance sensing operation. In another embodiment, a capacitance sensing circuit may operate in a differential sensing mode, forming the output signal proportional to the capacitance difference between two sensor elements. The differential sensing mode is especially useful for the working with the noisy signals, where noise is applied to two input terminals at same time.

Figure 8A:
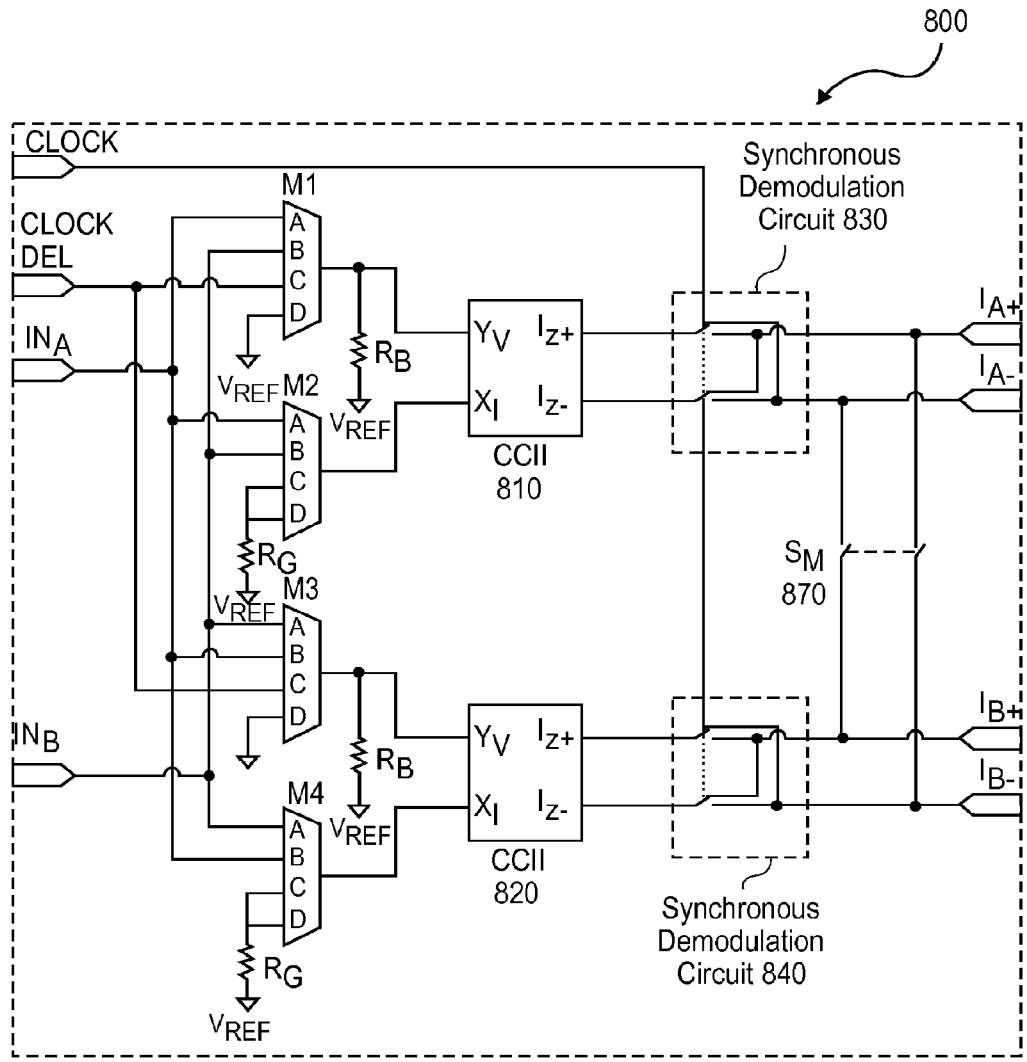
FIG. 8A illustrates a capacitance sensing circuit configurable for sensing either self-capacitance or mutual capacitance of sensor elements in dual-channel or single differential channel sensing modes, according to one embodiment.

FIG. 8A illustrates a capacitance sensing circuit 800 for sensing capacitance of sensor elements in single-ended and differential (dual-channel) sensing modes, according to one embodiment. As shown, the capacitance sensing circuit 800 includes the CCII 810, the CCII 820, the synchronous demodulation circuit 830, the synchronous demodulation circuit 840, and four multiplexers M1, M2, M3, and M4. In one embodiment, each of the synchronous demodulation circuits 830 and 840 is a full-wave synchronous demodulation circuit. Alternatively, other synchronous demodulation circuits could be used for the capacitance sensing circuit 800, as would be appreciated by one of ordinary skill in the art having the benefit of this disclosure The outputs of M1 and M2 are coupled to the voltage input terminal $Y_V$ and current input terminal $X_I$ of the CCII 810, respectively; the outputs of M3 and M4 are coupled to the voltage input terminal $Y_V$ and the current input terminal $X_I$ of the CCII 820, respectively. Each of the multiplexers M1, M2, M3, and M4 has four inputs. Each of the multiplexers M1 and M3 receives four inputs: one input $IN_A$ from the channel A, one input $IN_B$ from the channel B, and one clock input. The fourth input of the multiplexers M1 and M3 are grounded. Each of the multiplexers M2 and M4 receives two inputs: one input $IN_A$ from the channel A and one input $IN_B$ from the channel B. The third and the fourth inputs of the multiplexers M2 and M4 are connected via the resistor $R_G$ to some intermediate voltage potential (e.g. analog ground or reference source $V_{REF}$). The value of the resistor $R_G$ determines the circuit current gain level (transconductance). The resistors $R_B$ are bias resistors, which determine the CCII $Y_V$ input potential in the mutual capacitance sensing modes. The input $IN_A$ from channel A accepts either a current or voltage input from a first set of one or more sensor elements, and the input $IN_B$ from channel B (CH2) accepts either a current or voltage input from a second set of one or more sensor elements, and passes same to the associated current conveyor.

In one embodiment, the inputs to both channels are voltage inputs. In another embodiment, the inputs to both channels are current inputs. The capacitance sensing circuit 800 is capable of operating in six different sensing modes, as noted in the table which is part of FIG. 8A: a dual-channel single-ended self-capacitance sensing mode, a differential channel single-ended self-capacitance sensing mode, a dual-channel current-based mutual capacitance sensing mode, a dual-channel voltage-based mutual capacitance sensing mode, a differential channel current-based mutual capacitance sensing mode, and a differential channel voltage-based mutual capacitance sensing mode. It is possible to pair two channels to get differential sensing modes for each dual channel sensing mode, resulting in having one differential channel.

The balanced outputs of the CCII 810 and CCII 820 are coupled to the synchronous demodulation circuits 830 and 840 respectively. The switch SM 870 selects which pair of current outputs is going to be used for the current outputs of the capacitance sensing circuit 800.

The capacitance sensing circuit 800 may receive either current inputs or voltage inputs from the two input channels, i.e., from the $IN_A$ input terminal and the $IN_B$ input terminal. In one embodiment, the capacitance sensing circuit 800 receives two current inputs when the capacitance sensing circuit 800 is configured as a low-impedance receiver. In another embodiment, the capacitance sensing circuit 800 receives two voltage inputs when the capacitance sensing circuit 800 is configured as a high-impedance receiver. It should be noted that, in the current-based sensing mode, the capacitance sensing circuit input is a low-impedance receiver and the input signal is current, flowing into or out of the receiver. In the voltage-based sensing mode the capacitance sensing circuit input is a high-impedance receiver and the input signal is voltage, applied to the receiver input. It should be noted that various capacitance sensing circuits use the current-based sensing mode due better immunity to the noise, but some capacitance sensing circuits use voltage-based sensing mode, especially when operating with high resistance materials or when used differentially where coupled common mode noise may be rejected by the differential receiver.

Figure 8B:
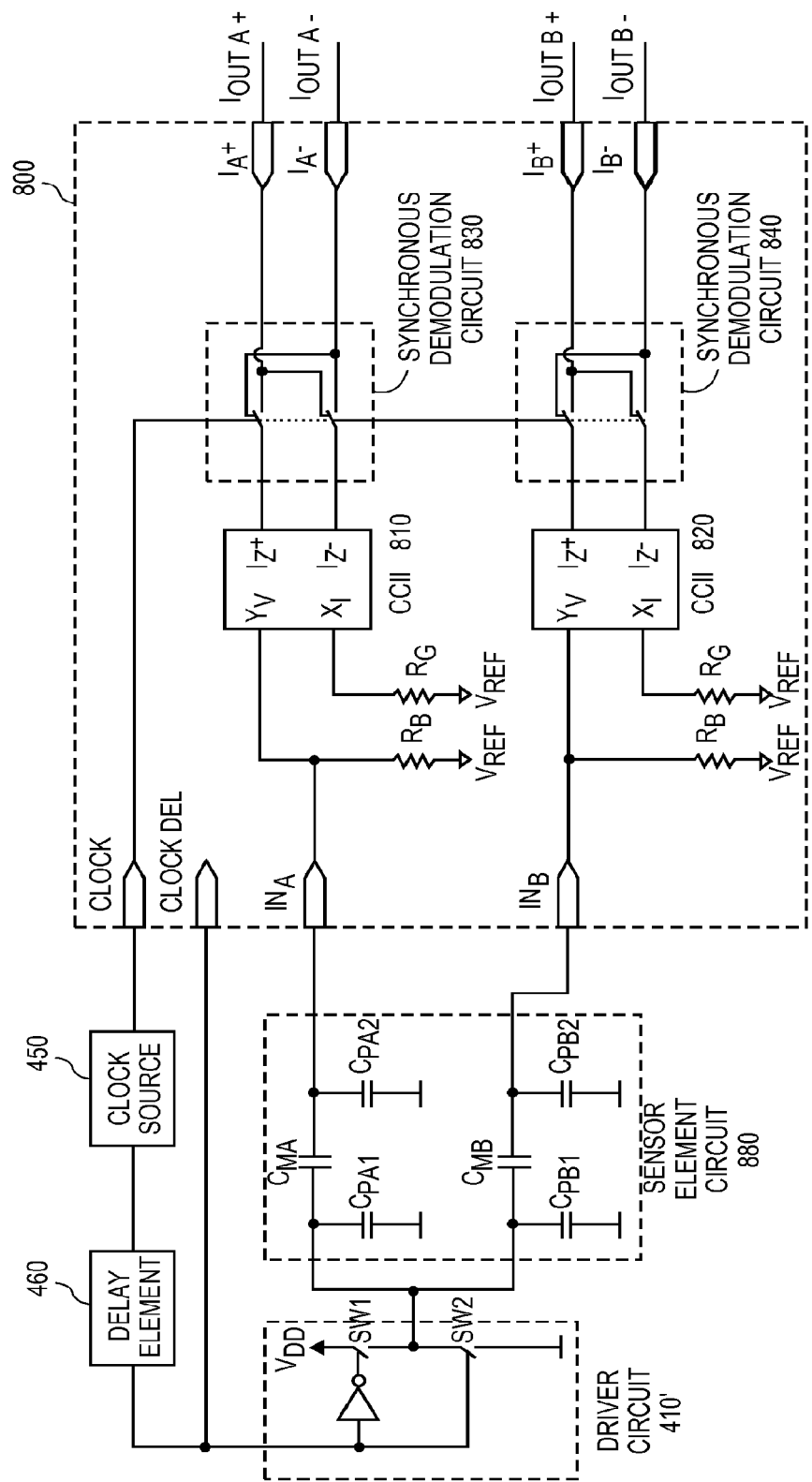
FIG. 8B illustrates a circuit configuration when the capacitance sensing circuit shown in FIG. 8A operates in a dual channel voltage-based mutual capacitance sensing mode.

The simplified schematics of the capacitance sensing circuit 800 in various sensing modes are shown in FIG. 8B-FIG. 8E. FIG. 8B shows the circuit configuration when the capacitance sensing circuit 800 operates in a dual-channel, voltage-based mutual capacitance sensing mode. As shown in FIG. 8B, one terminal of each of the mutual capacitors $C_{MA}$ and $C_{MB}$ of the sensor element circuit 880 is directly connected to the high-impedance input of the CCII 810 and CCII 820, respectively. The resistors $R_B$ set DC component of inputs. The resistors $R_G$ determine circuit gain in the dual-channel voltage-based mutual capacitance sensing mode, and CCII 810 and CCII 820 act as voltage to current translators with transconductance:

$$g_{cm} = \frac{1}{R_G}$$

Figure 8C:
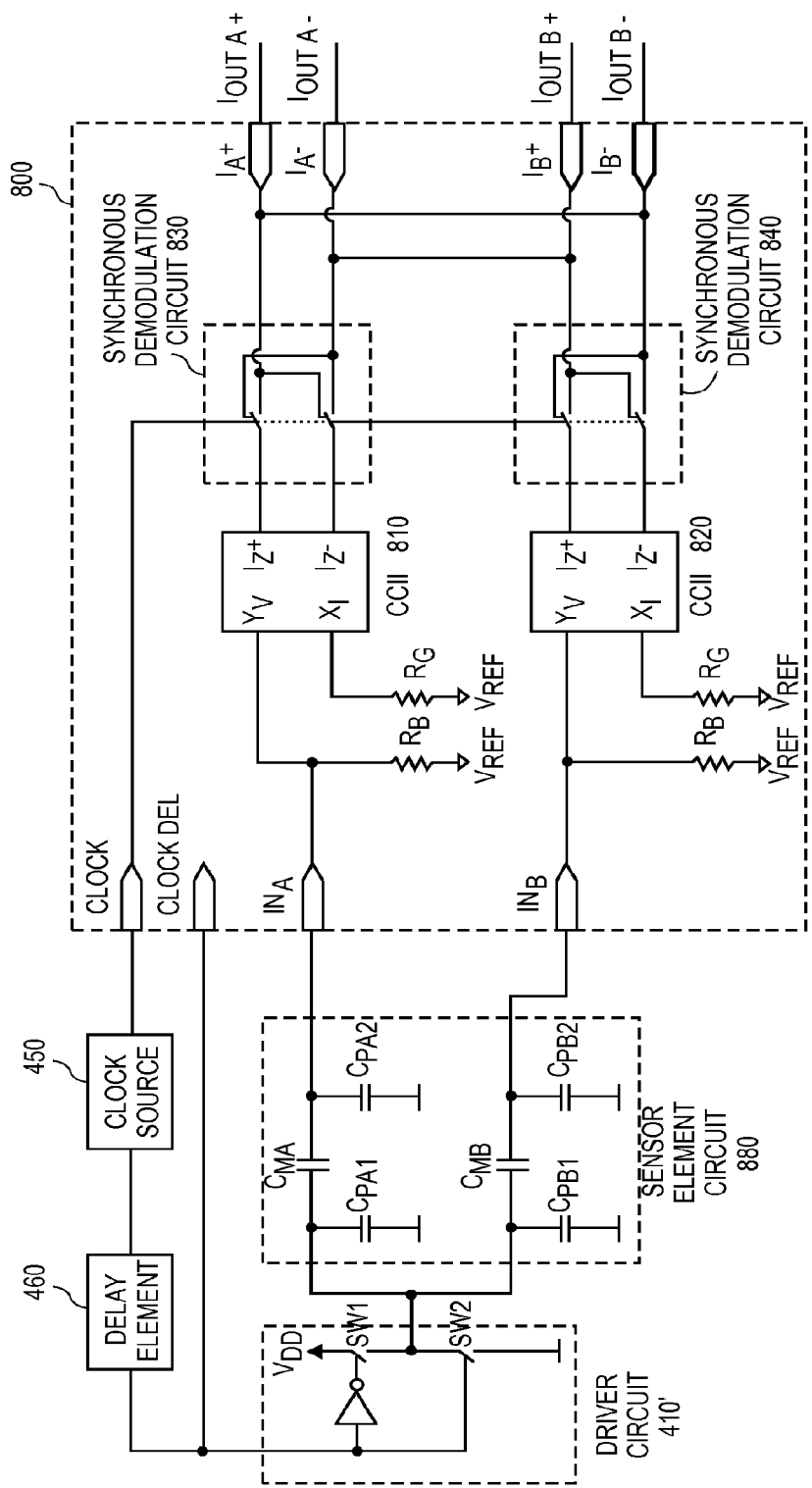
FIG. 8C illustrates a circuit configuration when the capacitance sensing circuit shown in FIG. 8A operates in a differential voltage-based mutual capacitance sensing mode.

FIG. 8C shows the circuit configuration when the capacitance sensing circuit 800 operates in a differential voltage-based mutual capacitance sensing mode. As shown, the difference between FIGS. 8B and 8C is that the balanced outputs of the synchronous demodulation circuits 830 and 840 in FIG. 8C are connected in opposite way, the resulted output current is difference between synchronous demodulation circuits 830 and 840 output currents.

Figure 8D:
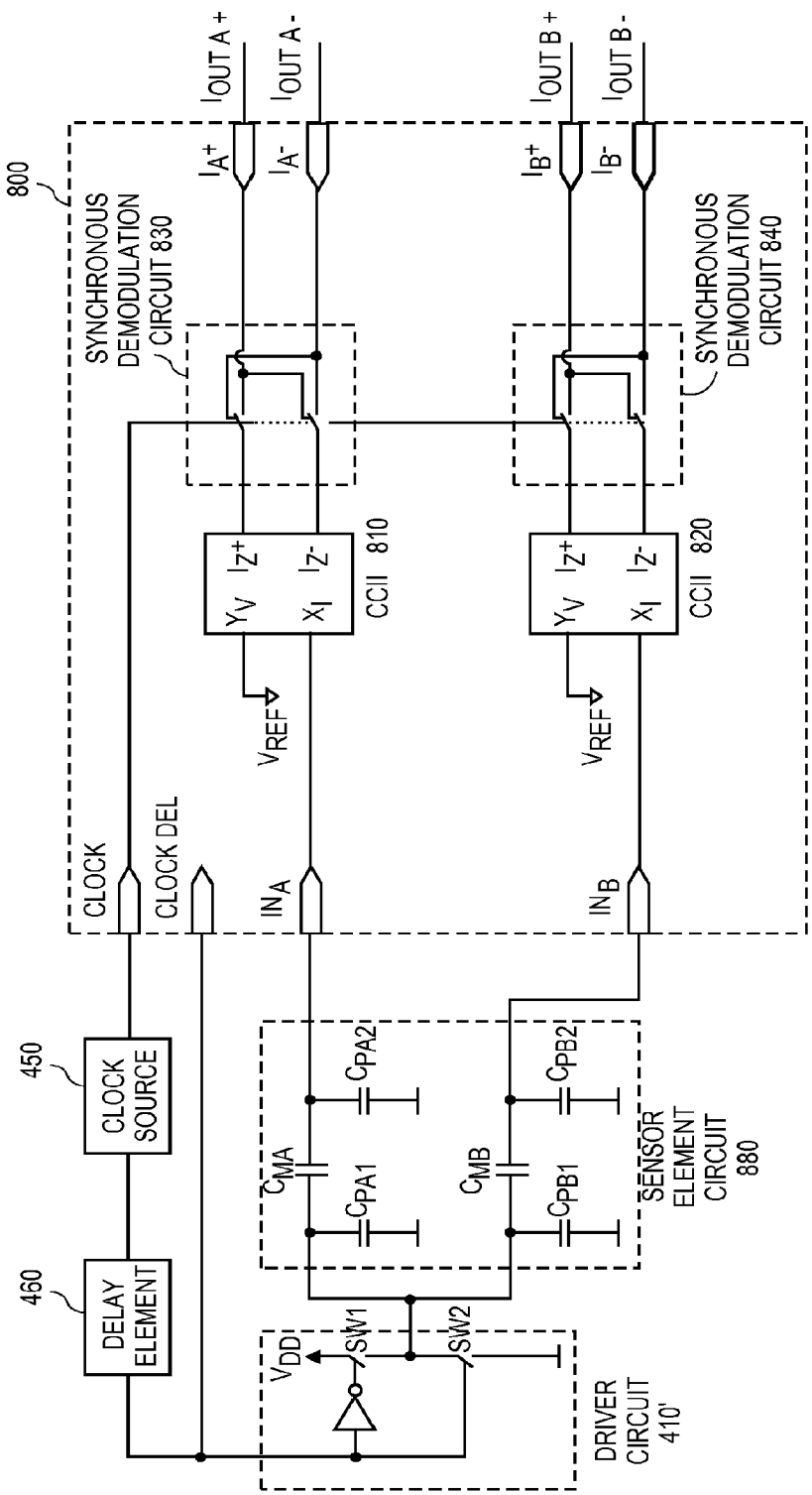
FIG. 8D illustrates a circuit configuration when the capacitance sensing circuit shown in FIG. 8A operates in a dual-channel current-based mutual capacitance sensing mode.

FIG. 8D shows the circuit configuration when the capacitance sensing circuit 800 operates in a dual-channel current-based mutual capacitance sensing mode. As shown in FIG. 8D, the high-impedance voltage input terminal $Y_V$ of each of the CCII 810 and CCII 820 is connected to the constant voltage reference $V_{REF}$, and the current input terminal $X_I$ of each of the CCII 810 and CCII 820 receives current input.

Figure 8E:
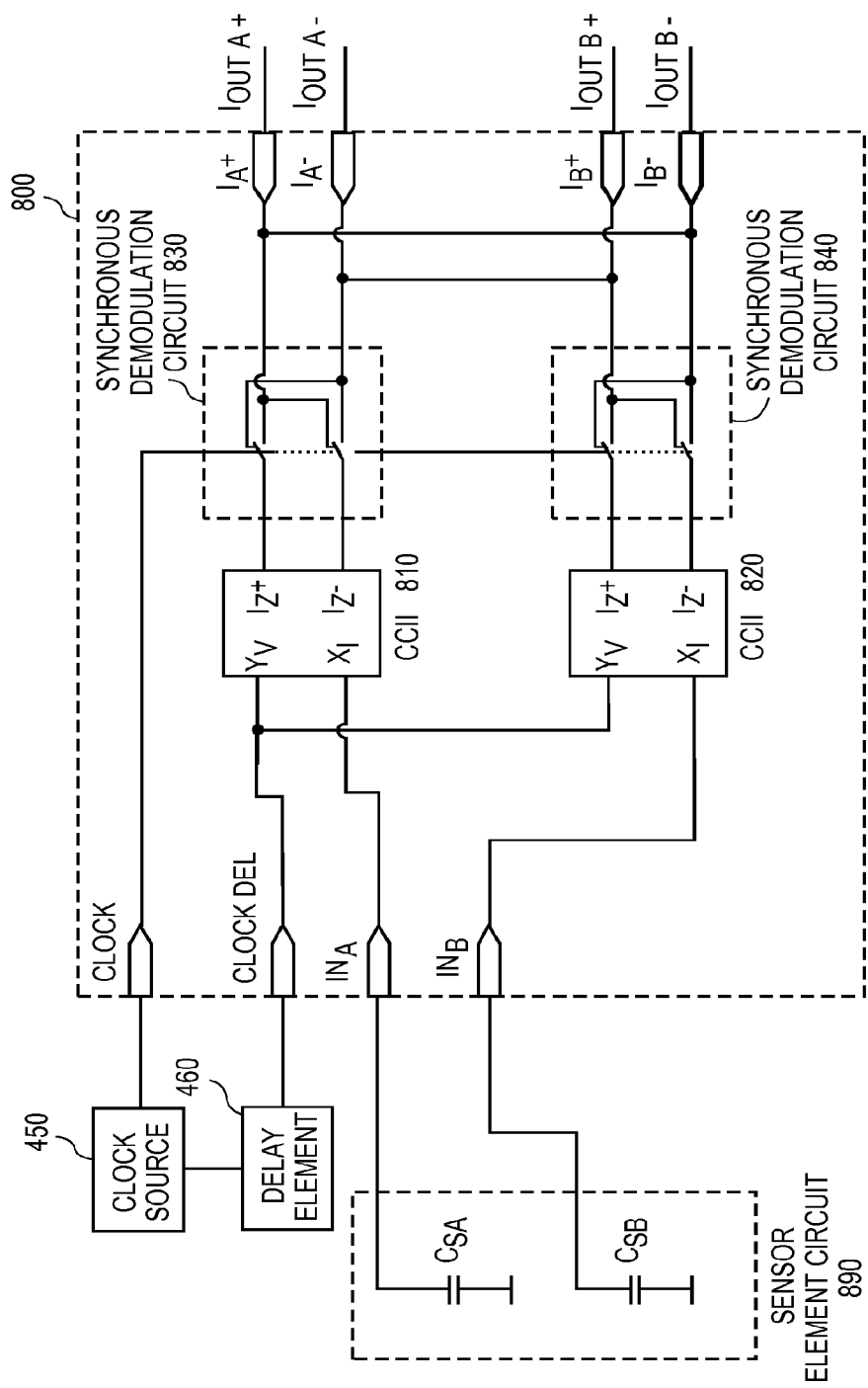
FIG. 8E illustrates a circuit configuration when the capacitance sensing circuit shown in FIG. 8A operates in a differential channel single-ended self-capacitance sensing mode.

FIG. 8E shows the circuit configuration when the capacitance sensing circuit 800 operates in a differential channel single-ended self-capacitance sensing mode. As shown, the delayed replica of the clock signal is applied to the high-impedance voltage input terminal $Y_V$ of each of the CCII 810 and CCII 820. The CCII 810 and CCII 820 translates the voltage received from their respective voltage input terminal into the current input at the current input terminal $X_I$ of each of the CCII 810 and CCII 820, causing the sensor element circuit 890 excitation. Then, each of the CCII 810 and CCII 820 subtracts the signals received from two channels (CH A and CH B).

The circuit configuration for the capacitance sensing circuit 800 operating in a dual-channel single-ended self-capacitance sensing mode is similar to the one shown in FIG. 8E, and the difference between those two circuit configurations are that the outputs of the synchronous demodulation circuits 830 and 840 are not joined together when the capacitance sensing circuit 800 operates under the dual-channel single-ended self-capacitance sensing mode. In one embodiment, the capacitance sensing circuit 800, when operating in the single electrode sensing mode, may include a level translator, which translates the digital clock levels into the voltage applied to the voltage input of each of the CCII, e.g. supplying the predefined REF_HI level of the voltage to CCII at High level of the clock signal and applying the predefined REF_LO level at low.

The other embodiments of the proposed invention are possible, for example, there is possible to exchange the synchronous detector and differential mode switch.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain portions of the embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will be evident, however, that various modifications and changes may be made thereto without departing from the broader spirit and scope of the invention as set forth in the appended claims. The specification and drawings are, accordingly, to be regarded in an illustrative sense rather than a restrictive sense.

What is claim is:

1. A capacitance sensing device, comprising:
a first plurality of sensor elements;
a second plurality of sensor elements;
a capacitance sensing circuit coupled to the first and second pluralities of sensor elements, the capacitance sensing circuit configured to generate a first current representative of a self capacitance of at least one of the first plurality of sensor elements and configured to generate a second current representative of a mutual capacitance of at least one of the second plurality of sensor elements; and
a conversion circuit configured to convert the first current to a first digital value and the second current to a second digital value,
wherein the capacitance sensing circuit is configured to generate the first current and the second current in response to a signal from a mode selection circuit.

2. The capacitance sensing device of claim 1, wherein the first plurality of sensor elements is disposed in a plurality of rows or a plurality of columns.

3. The capacitance sensing device of claim 1, wherein the second plurality of sensor elements are intersections between a plurality of row electrodes and a plurality of columns electrodes.

4. The capacitance sensing device of claim 1, wherein the capacitance sensing circuit includes a current conveyor comprising:
a first voltage input coupled to an output of the mode selection circuit;
a second current input coupled to the first plurality of sensor elements and the
second plurality of sensor elements; and
a plurality of outputs coupled to a synchronous demodulation circuit that is configured to generate based on the plurality of outputs the first current and the second current.

5. The capacitance sensing device of claim 4, wherein the output of the mode selection circuit is configured to apply a clock signal to the first voltage input of the current conveyor, and the second current input of the current conveyor is coupled to the one or more sensor elements when the self-capacitance sensing mode is selected.

6. The capacitance sensing device of claim 4, wherein the output of the mode selection circuit is configured to apply a constant-reference voltage to the first voltage input of the current conveyor, and the second current input of the current conveyor is coupled to a first electrode of the one or more sensor elements when the mutual capacitance sensing mode is selected.

7. The capacitance sensing device of claim 4, wherein the synchronous demodulation circuit is configured to generate a current output in response to the self capacitance or the mutual capacitance.

8. A method comprising:
generating a first current representative of a self capacitance of one of a plurality of self capacitance sensor elements in a first mode;
generating a second current representative of a mutual capacitance of one of a plurality of mutual capacitance sensor elements in a second mode; and
selecting between the first mode and the second mode based on an output of a mode selection circuit coupled to a first voltage input of a conversion circuit.

9. The method of claim 8, wherein the plurality of self capacitance sensor elements comprises rows or columns of electrodes.

10. The method of claim 8, wherein the plurality of mutual capacitance sensor elements comprises a plurality of intersections between a plurality of row electrodes and a plurality of column electrodes.

11. The method of claim 8, wherein the selecting between the first mode and the second mode comprises:
applying a clock signal to the first voltage input of the conversion circuit, wherein a second current input of the conversion circuit is coupled to at least one of the plurality of self capacitance sensor elements.

12. The method of claim 8, wherein the selecting between the first mode and the second mode comprises:
applying a constant reference voltage to the first voltage input of the conversion circuit, wherein a second current input of the conversion circuit is coupled to a first electrode of at least one of the plurality of mutual capacitance sensor elements.

13. The method of claim 8, further comprising:
converting the first current to a first digital value in the first mode; and converting the second current to a second digital value in the second mode.

14. The method of claim 8, wherein the converting the self capacitance and mutual capacitance to first and second currents, respectively, is performed by a current conveyor coupled to the self capacitance sensor elements and the mutual capacitance sensor elements at a first current input and to a synchronous demodulation circuit at a first and second output.

15. A two-dimensional user interface comprising:
a first plurality of row sensor elements;
a second plurality of column sensor elements;
a capacitance sensing circuit coupled to the first and second pluralities of sensor elements, the capacitance sensing circuit configured to generate a first current representative of a self capacitance of at least one of the first plurality of sensor elements and configured to generate a second current representative of a mutual capacitance of at least one of the second plurality of sensor elements; and
a conversion circuit configured to convert the first current to a first digital value and the second current to a second digital value,
wherein the capacitance sensing circuit is configured to generate the first current and the second current in response to a signal from a mode selection circuit.

16. The two dimensional interface of claim 15, wherein the capacitance sensing circuit includes a current conveyor comprising:
a first voltage input coupled to an output of the mode selection circuit;
a second current input coupled to the row sensor elements; and a plurality of outputs coupled to a synchronous demodulation circuit that is configured to generate based on the plurality of outputs the first current and the second current.

17. The two dimensional user interface of claim 16, wherein the output of the mode selection circuit is configured to apply a clock signal to the first voltage input of the current conveyor, and the second current input of the current conveyor is coupled to the one or more row sensor elements when the self-capacitance sensing mode is selected.

18. The two dimensional user interface of claim 16, wherein the output of the mode selection circuit is configured to apply a constant reference voltage to the voltage input of the current conveyor, and the second current input of the current conveyor is coupled to a row electrode when the mutual capacitance sensing mode is selected.

\* \* \* \* \*